US012599000B2

(12) United States Patent
Lee et al.

(10) Patent No.: US 12,599,000 B2
(45) Date of Patent: Apr. 7, 2026

(54) NON-VOLATILE MEMORY DEVICE INCLUDING FIRST AND SECOND MONITORING CHANNEL STRUCTURES AND NON-VOLATILE MEMORY SYSTEM COMPRISING THE SAME

(71) Applicant: Samsung Electronics Co., Ltd., Suwon-si (KR)

(72) Inventors: Jung-Hwan Lee, Seoul (KR); Jin-Soo Lim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1006 days.

(21) Appl. No.: 17/702,400

(22) Filed: Mar. 23, 2022

(65) Prior Publication Data

US 2023/0010192 A1     Jan. 12, 2023

(30) Foreign Application Priority Data

Jul. 8, 2021     (KR) ........................ 10-2021-0089412

(51) Int. Cl.
H01L 23/544     (2006.01)
H10B 41/27     (2023.01)
     (Continued)

(52) U.S. Cl.
CPC ........... H01L 23/544 (2013.01); H10B 41/27 (2023.02); H10B 41/41 (2023.02); H10B 43/27 (2023.02);
     (Continued)

(58) Field of Classification Search
CPC ........ H10B 41/27; H10B 41/41; H10B 43/20; H10B 43/27; H10B 43/30; H10B 43/40; H10B 43/50; H10B 43/41; H10B 43/10
See application file for complete search history.

(56) References Cited

U.S. PATENT DOCUMENTS 9,853,043 B2     12/2017 Lu et al.
10,777,574 B2     9/2020 Shishido et al.
     (Continued)

FOREIGN PATENT DOCUMENTS

KR     100238224 B1     1/2000
KR     20110108770 A     10/2011
     (Continued)

OTHER PUBLICATIONS

European Search Report corresponding to European Application No. 22164962.7 (Sep. 28, 2022).
     (Continued)

*Primary Examiner* — Khiem D Nguyen
(74) *Attorney, Agent, or Firm* — Wolf, Greenfield & Sacks, P.C.

(57)     ABSTRACT

A non-volatile memory device and a non-volatile memory system comprising the same are provided. The non-volatile memory device includes a first stack in which a first conductive pattern and a first dielectric layer are alternately stacked in a first direction on a substrate, a second stack in which a second conductive pattern and a second dielectric layer are alternately stacked in the first direction on the first stack opposite the substrate, a first monitoring channel structure that penetrates the first stack in the first direction, and a second monitoring channel structure that penetrates the second stack in the first direction and is on the first monitoring channel structure. A width of a top of the first monitoring channel structure opposite the substrate is smaller than a width of a bottom of the second monitoring channel structure adjacent the top of the first monitoring channel structure.

20 Claims, 25 Drawing Sheets

(51) Int. Cl.
  H10B 41/41  (2023.01)
  H10B 43/27  (2023.01)
  H10B 43/40  (2023.01)

(52) U.S. Cl.
  CPC .... H10B 43/40 (2023.02); *H01L 2223/54426*
                                                    (2013.01)

(56)              References Cited

U.S. PATENT DOCUMENTS

| | | | | |
|---|---|---|---|---|
| 11,626,419 | B2 * | 4/2023 | Lee | H10B 43/35 |
| | | | | 257/314 |
| 2016/0079164 | A1 * | 3/2016 | Fukuzumi | H10B 43/30 |
| | | | | 438/107 |
| 2020/0365560 | A1 * | 11/2020 | Kanamori | H01L 25/50 |
| 2020/0411543 | A1 | 12/2020 | Wang et al. | |
| 2020/0411548 | A1 | 12/2020 | Komiya | |
| 2021/0028058 | A1 | 1/2021 | Kim | |
| 2021/0066145 | A1 * | 3/2021 | Kim | H01L 24/05 |

| | | | | |
|---|---|---|---|---|
| 2021/0066342 | A1 * | 3/2021 | Furuki | H01L 23/544 |
| 2021/0183885 | A1 * | 6/2021 | Woo | G11C 8/14 |
| 2021/0202382 | A1 | 7/2021 | Okina | |
| 2022/0005826 | A1 * | 1/2022 | Lim | H10B 43/27 |
| 2022/0173119 | A1 * | 6/2022 | Choi | H10B 43/40 |

FOREIGN PATENT DOCUMENTS

| | | |
|---|---|---|
| KR | 10-2024715 B1 | 9/2019 |
| KR | 20200070610 A | 6/2020 |
| KR | 20200085243 A | 7/2020 |
| KR | 102171221 B1 | 10/2020 |
| KR | 20210053824 A | 5/2021 |
| KR | 20210083427 A | 7/2021 |
| WO | 2020211272 A1 | 10/2020 |

OTHER PUBLICATIONS

European Office Action corresponding to European Application No.
22164962.7 (Oct. 10, 2022).

* cited by examiner

MCHH1

330I_1
SL$_k$
330I_1

PST_1

330I_1
SL$_0$
330I_1
151
310

Y
X
Z

1

<u>2</u>

4

I - I'

I - I'

NON-VOLATILE MEMORY DEVICE INCLUDING FIRST AND SECOND MONITORING CHANNEL STRUCTURES AND NON-VOLATILE MEMORY SYSTEM COMPRISING THE SAME

CROSS-REFERENCE TO RELATED APPLICATION

This application claims priority from Korean Patent Application No. 10-2021-0089412 filed on Jul. 8, 2021, in the Korean Intellectual Property Office, and all the benefits accruing therefrom under 35 U.S.C. 119, the contents of which in its entirety are herein incorporated by reference.

FIELD

The present invention relates to a non-volatile memory device and a non-volatile memory system comprising the same.

BACKGROUND

There is demand for non-volatile memory devices capable of high-capacity data storage in non-volatile memory systems. Accordingly, options that may increase a data storage capacity of the non-volatile memory device are being studied. For example, a non-volatile memory including three-dimensionally arranged memory cells instead of two-dimensionally arranged memory cells has been proposed for increasing the data storage capacity of non-volatile memory devices.

SUMMARY

Aspects of the present invention provide a non-volatile memory device including a monitoring channel structure that can be used to effectively monitor misalignment of channel structures forming a plurality of layers.

Aspects of the present invention also provide a non-volatile memory system including a monitoring channel structure that can be used to effectively monitor the misalignment of channel structures forming a plurality of layers.

According to an aspect of the present inventive concept, there is provided a non-volatile memory device comprising, a first stack in which first conductive patterns and first dielectric layers are alternately stacked in a first direction on a substrate, a second stack in which second conductive patterns and second dielectric layers are alternately stacked in the first direction on the first stack opposite the substrate, a first monitoring channel structure which penetrates the first stack in the first direction, and a second monitoring channel structure which penetrates the second stack in the first direction and is on the first monitoring channel structure, wherein a width of a top of the first monitoring channel structure opposite the substrate is smaller than a width of a bottom of the second monitoring channel structure adjacent the top of the first monitoring channel structure.

According to an aspect of the present inventive concept, there is provided a non-volatile memory device comprising, a first stack in which first conductive patterns and first dielectric layers are alternately stacked in a first direction, a second stack in which second conductive patterns and second dielectric layers are alternately stacked in the first direction on the first stack, a first monitoring channel structure which penetrates the first stack in the first direction, a second monitoring channel structure which penetrates the second stack in the first direction and is on the first monitoring channel structure, and a capping film on the second monitoring channel structure, wherein a width of a top of the first monitoring channel structure is smaller than a width of a bottom of the second monitoring channel structure opposite the capping film, the first monitoring channel structure and the second monitoring channel structure include a data storage layer, a channel layer, and a buried insulating layer that are sequentially stacked along side walls of the first monitoring channel structure and side walls of the second monitoring channel structure.

According to an aspect of the present inventive concept, there is provided a non-volatile memory system comprising, a non-volatile memory device which includes a first stack in which first conductive patterns and first dielectric layers are alternately stacked in a first direction on a substrate, a second stack in which second conductive patterns and second dielectric layers are alternately stacked in the first direction on the first stack opposite the substrate, a first monitoring channel structure which penetrates the first stack in the first direction, a second monitoring channel structure which penetrates the second stack in the first direction and is on the first monitoring channel structure, a width of a top of the first monitoring channel structure opposite the substrate being smaller than a width of a bottom of the second monitoring channel structure adjacent the top of the first monitoring channel structure, a peripheral circuit including a decoder, a page buffer, and a logic circuit, and an I/O pad which is electrically connected to the peripheral circuit; and a controller which is electrically connected to the non-volatile memory device through the I/O pad and is configured to control the non-volatile memory device.

BRIEF DESCRIPTION OF THE DRAWINGS

FIG. 3 is an example top view of the A-A' cross section of FIG. 2 as viewed from above.

FIG. 5 is an example top view of the B-B' cross section of FIG. 4 as viewed from above.

FIG. 7 is an example top view of a C-C' cross section of FIG. 6 as viewed from above.

DETAILED DESCRIPTION OF THE EMBODIMENTS

Figure 1:
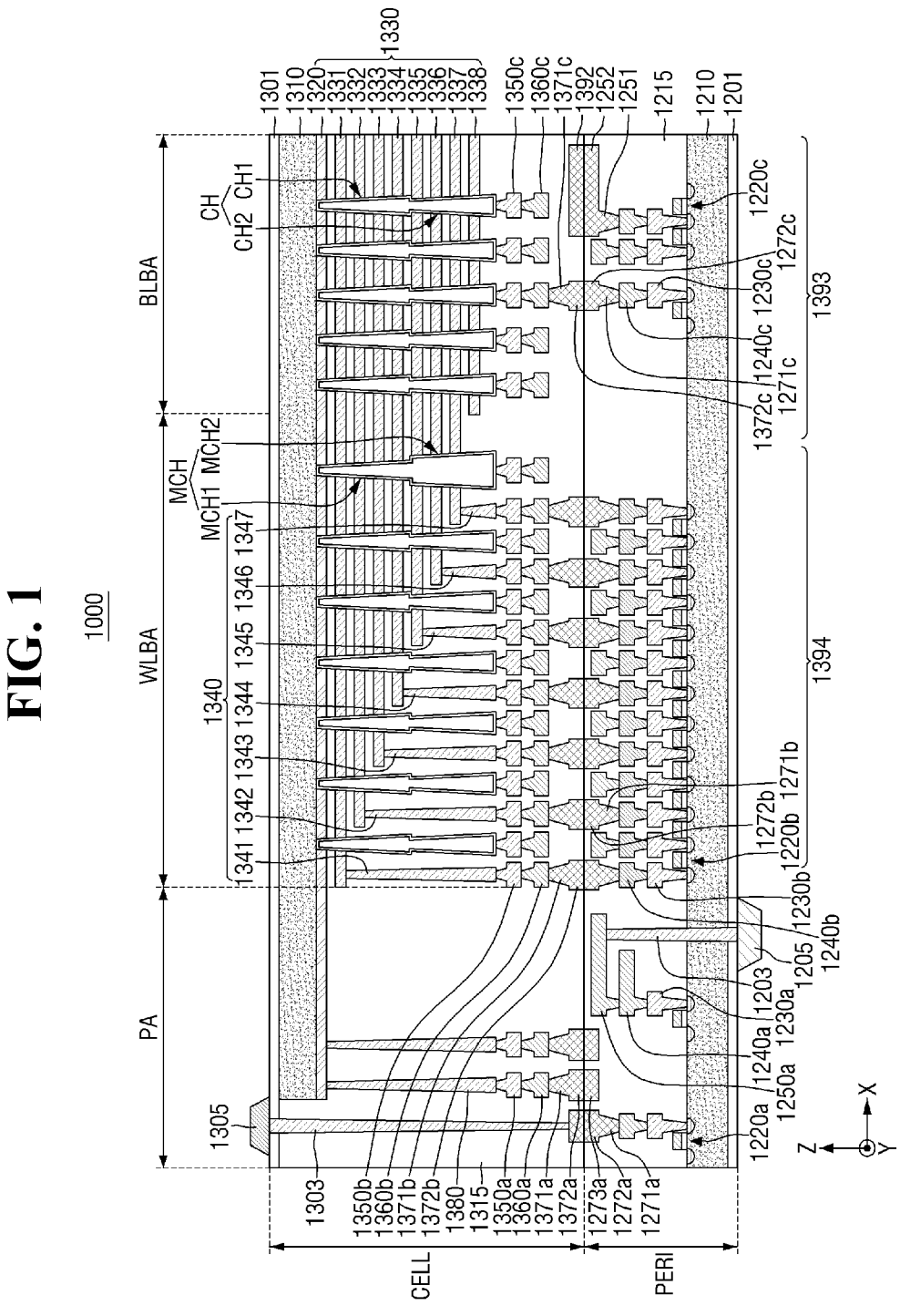
FIGS. 1 to 2 are example diagrams for explaining the non-volatile memory device according to some embodiments.
Figure 2:
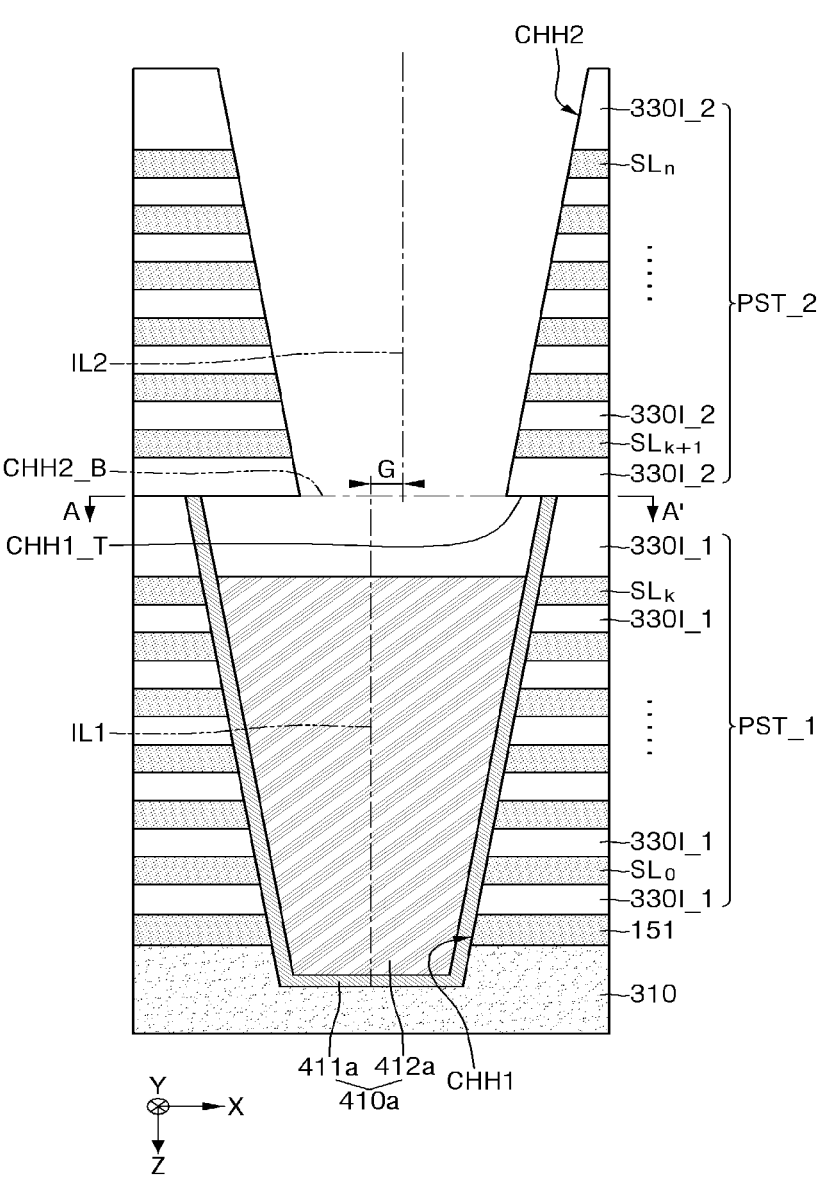

FIGS. 1 to 2 are example diagrams for explaining the non-volatile memory device according to some embodiments. Spatially relative terms, such as "beneath," "below," "lower," "bottom," "under," "above," "upper," "top," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings may be turned over, elements described as "below" or "beneath" or "under" other elements or features would then be oriented "above" the other elements or features. Thus, the example terms "below" and "under" may encompass both an orientation of above and below. The device may be otherwise oriented, for example, rotated 90 degrees or at other orientations, and the spatially relative descriptors used herein should be interpreted accordingly.

Referring to FIG. 1, a non-volatile memory device 1000 according to some embodiments may have a C2C (chip to chip) structure. The C2C structure may mean a structure in which an upper chip including a cell region CELL is manufactured on a first wafer and a lower chip including a peripheral circuit region PERI is manufactured on a second wafer different from the first wafer, and then, the upper chip and the lower chip are connected to each other by a bonding way or technique. As an example, the bonding way or technique may refer to a way of electrically connecting a bonding metal formed on an uppermost metal layer of the upper chip and a bonding metal formed on an uppermost metal layer of the lower chip to each other. For example, when the bonding metal is formed of copper (Cu), the bonding way may be a Cu-Cu bonding way, and the bonding metal may also be formed of aluminum or tungsten.

Each of the peripheral circuit region PERI and the cell region CELL of the non-volatile memory device 1000 may include an external pad bonding region PA, a word line bonding region WLBA, and a bit line bonding region BLBA.

The peripheral circuit region PERI may include a first substrate 1210, an interlayer insulating layer 1215, a plurality of circuit elements 1220a, 1220b and 1220c formed on the first substrate 1210, first metal layers 1230a, 1230b and 1230c connected to each of the plurality of circuit elements 1220a, 1220b and 1220c, and second metal layers 1240a, 1240b and 1240c formed on the first metal layers 1230a, 1230b and 1230c. The terms "first," "second," etc. may be used herein merely to distinguish one element from another. In an embodiment, the first metal layer 1230a, 1230b and 1230c may be formed of tungsten, which has a relatively high resistance, and the second metal layers 1240a, 1240b and 1240c may be formed of copper, which has a relatively low resistance.

Although only the first metal layers 1230a, 1230b and 1230c and the second metal layers 1240a, 1240b and 1240c are shown and explained in the present specification, the present invention is not limited thereto, and least one or more metal layers may be further formed on the second metal layers 1240a, 1240b and 1240c. At least some of one or more metal layers formed on the second metal layers 1240a, 1240b and 1240c may be formed of aluminum or the like which has a lower resistance than the copper that forms the second metal layers 1240a, 1240b and 1240c.

The interlayer insulating layer 1215 is placed on the first substrate 1210 to cover the plurality of circuit elements 1220a, 1220b and 1220c, the first metal layers 1230a, 1230b and 1230c, and the second metal layers 1240a, 1240b and 1240c, and may include insulating materials such as silicon oxides and silicon nitrides Lower bonding metals 1271b and 1272b may be formed on the second metal layer 1240b of the word line bonding region WLBA. In the word line bonding region WLBA, the lower bonding metals 1271b and 1272b of the peripheral circuit region PERI may be electrically connected to the upper bonding metals 1371b and 1372b of the cell region CELL by a bonding way, and the lower bonding metals 1271b and 1272b and the upper bonding metals 1371b and 1372b may be formed of aluminum, copper, tungsten, or the like. The word line bonding region WLBA may also be called a dummy region.

The cell region CELL may provide at least one memory block. The cell region CELL may include a second substrate 1310 and a common source line 1320. A plurality of word lines (1331 to 1338; collectively 1330) may be stacked on the second substrate 1310 along a first direction (+Z-axis direction) perpendicular to an upper side of the second substrate 1310. String selection lines and a ground selection line may be placed at the top and bottom of the word line 1330, and a plurality of word lines 1330 may be placed between the string selection lines and the ground selection line.

In the bit line bonding region BLBA, the channel structure CH extends in a direction perpendicular to the upper side of the second substrate 1310 and may penetrate the word lines 1330, the string selection lines, and the ground selection line. The channel structure CH may include a data storage layer, a channel layer, a buried insulating layer, etc., and the channel layer may be electrically connected to the first metal layer 1350c and the second metal layer 1360c. For example, the first metal layer 1350c may be a bit line contact, and the second metal layer 1360c may be a bit line. In an embodiment, the bit line 1360c may extend along a first direction (an Y-axis direction) parallel to the upper side of the second substrate 1310.

The channel structure CH may include a first channel structure CH1 that penetrates at least a part of the word lines 1330 and the common source line 1320 in the first direction (+Z-axis direction), and a second channel structure CH2 that penetrates the rest of the word lines 1330. That is, the channel structures CH may be formed as a structure having a plurality of layers. The number of layers included in the channel structures CH is not limited to this drawing, and may have three or more layers.

Figure 7:
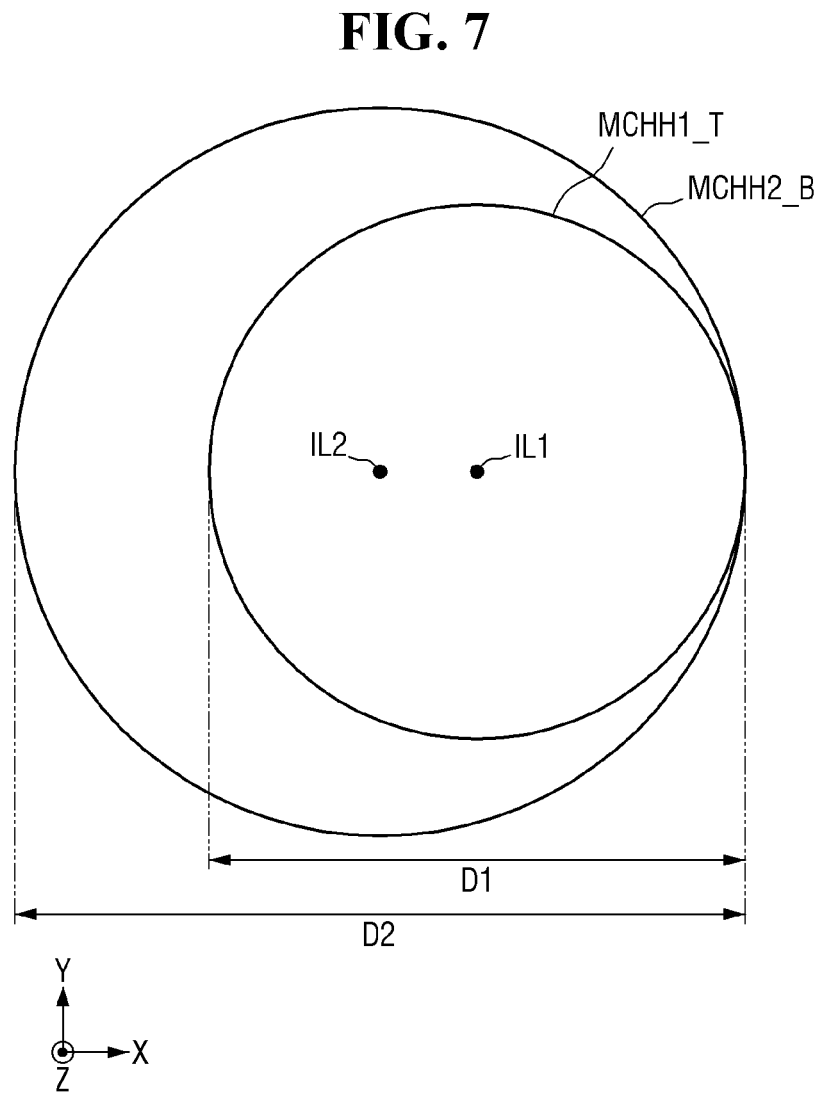

In an embodiment shown in FIG. 7, a region in which the channel structure CH, the bit line 1360c and the like are placed may be defined as the bit line bonding region BLBA. The bit line 1360c may be electrically connected to the circuit elements 1220c that are provided through a page buffer 1393 in the peripheral circuit region PERI, in the bit line bonding region BLBA. As an example, the bit line 1360c is connected to the upper bonding metals 1371c and 1372c in the peripheral circuit region PERI, and the upper bonding metals 1371c and 1372c may be connected to the lower bonding metals 1271c and 1272c connected to the circuit elements 1220c of the page buffer 1393.

In the word line bonding region WLBA, the word lines 1330 may extend along a second direction (an X-axis direction) parallel to the upper side of the second substrate 1310, and may be connected to a plurality of cell contact plugs (1341 to 1347; collectively 1340). The word lines 1330 and the cell contact plugs 1340 may be connected to each other with pads provided by extension of at least some of the word lines 1330 along the second direction D1 (the X-axis direction) with different lengths. A first metal layer 1350*b* and a second metal layer 1360*b* may be connected sequentially to the upper parts of the cell contact plugs 1340 connected to the word lines 1330. The cell contact plugs 1340 may be connected to the peripheral circuit region PERI through the upper bonding metals 1371*b* and 1372*b* of the cell region CELL and the lower bonding metals 1271*b* and 1272*b* of the peripheral circuit region PERI in the word line bonding region WLBA.

The cell contact plugs 1340 may be electrically connected to the circuit elements 1220*b* that provide a row decoder 1394 in the peripheral circuit region PERI. In an embodiment, the operating voltage of the circuit elements 1220*b* that provide the row decoder 1394 may differ from the operating voltage of the circuit elements 1220*c* that provide the page buffer 1393. As an example, the operating voltage of the circuit elements 1220*c* that provide the page buffer 1393 may be higher than the operating voltage of the circuit elements 1220*b* that provide the row decoder 1394.

A common source line contact plug 1380 may be placed in the external pad bonding region PA. The common source line contact plug 1380 is formed of a conductive material such as metal, metal compound or polysilicon, and may be electrically connected to the common source line 1320. The first metal layer 1350*a* and the second metal layer 1360*a* may be stacked sequentially on the upper part of the common source line contact plug 1380. As an example, a region in which the common source line contact plug 1380, the first metal layer 1350*a*, and the second metal layer 1360*a* are placed may be defined as an external pad bonding region PA.

In addition or alternatively, I/O pads 1205 and 1305 may be placed in the external pad bonding region PA. Referring to FIG. 1, a lower insulating film 1201 which covers the lower side of the first substrate 1210 may be formed below the first substrate 1210, and a first I/O pad 1205 may be formed on the lower insulating film 1201. The first I/O pad 1205 is attached to at least one of a plurality of circuit elements 1220*a*, 1220*b* and 1220*c* placed in the peripheral circuit region PERI through the first I/O contact plug 1203, and may be separated from the first substrate 1210 by the lower insulating film 1201. Further, a side insulating film may be placed between the first I/O contact plug 1203 and the first substrate 1210 to electrically separate the first I/O contact plug 1203 and the first substrate 1210 from each other.

Referring to FIG. 1, an upper insulating film 1301, which covers the upper side of the second substrate 1310, may be formed on the second substrate 1310, and a second I/O pad 1305 may be placed on the upper insulating film 1301. The second I/O pad 1305 may be connected to at least one of a plurality of circuit elements 1220*a*, 1220*b* and 1220*c* placed in the peripheral circuit region PERI through the second I/O contact plug 1303.

According to the embodiments, the second substrate 1310, the common source line 1320 and the like may not be placed in a region in which the second I/O contact plug 1303 is placed. Further, the second I/O pad 1305 may not overlap the word lines 1380 in the first direction (+Z-axis direction). Referring to FIG. 1, the second I/O contact plug 1303 is separated from the second substrate 1310 in a direction parallel to the upper side of the second substrate 1310, penetrates the interlayer insulating layer 1315 of the cell region CELL, and may be connected to the second I/O pad 1305.

According to the embodiments, the first I/O pad 1205 and the second I/O pad 1305 may be selectively formed. As an example, the non-volatile memory device 1000 may include only the first I/O pad 1205 placed on the upper part of the first substrate 1201, or may include only a second I/O pad 1305 placed on the upper part of the second substrate 1301. Alternatively, the non-volatile memory device 1000 may include both a first I/O pad 1205 and a second I/O pad 1305.

The non-volatile memory device 1000 may form a lower metal pattern 1273*a* having the same shape as the upper metal pattern 1372*a* of the cell region CELL on the uppermost metal layer of the peripheral circuit region PERI to correspond to the upper metal pattern 1372*a* formed on the uppermost metal layer of the cell region CELL, in the external pad bonding region PA. The lower metal pattern 1273*a* formed on the uppermost metal layer of the peripheral circuit region PERI may not be connected to a separate contact in the peripheral circuit region PERI. Similarly, an upper metal pattern having the same shape as the lower metal pattern of the peripheral circuit region PERI may be formed on the upper metal layer of the cell region CELL to correspond to the lower metal pattern formed on the uppermost metal layer of the peripheral circuit region PERI, in the external pad bonding region PA.

Lower bonding metals 1271*b* and 1272*b* may be formed on the second metal layer 1240*b* of the word line bonding region WLBA. In the word line bonding region WLBA, the lower bonding metals 1271*b* and 1272*b* of the peripheral circuit region PERI may be electrically connected to the upper bonding metals 1371*b* and 1372*b* of the cell region CELL by a bonding way or technique.

Further, an upper metal pattern 1392 having the same shape as the lower metal pattern 1252 of the peripheral circuit region PERI may be formed on the uppermost metal layer of the cell region CELL to correspond to the lower metal pattern 1252 formed on the uppermost metal layer of the peripheral circuit region PERI, in the bit line bonding region BLBA. A contact may not be formed on the upper metal pattern 1392 formed on the uppermost metal layer of the cell region CELL.

A metal pattern of the uppermost metal layer may exist as a dummy pattern in each of the external pad bonding region PA and the bit line bonding region BLBA included in each of the cell region CELL and the peripheral circuit region PERI, or the uppermost metal layer may be empty.

The channel structures placed in the word line bonding region WLBA may not form a contact on the second metal layer 1360*b*, unlike the channel structures CH placed in the bit line bonding region BLBA.

That is, the channel structures placed in the word line bonding region WLBA are dummy structures, which may not be electrically connected to the bit line, unlike the channel structures CH placed in the bit line bonding region BLBA.

The dummy structures may be provided for ensuring stability in the fabricating process of the non-volatile memory device 1000 according to some embodiments. Further, the dummy structures may also serve as a monitoring channel structure MCH that monitors misalignment of the channel structures CH that may occur in the fabricating process of the non-volatile memory device 1000 according to some embodiments.

The monitoring channel structure MCH also could be configured to store data.

In detail, in order to increase the data storage capacity of the non-volatile memory device 1000 according to some embodiments, the number of word lines 1330 of the bit line bonding region BLBA may increase. Accordingly, the height of the channel structures CH of the bit line bonding region BLBA also increases. However, as the height of the channel structures CH increases, upright stability of the channel structures CH may be dangerous or jeopardized. For example, if the height of the channel structures CH is excessively high, the channel structures CH may collapse.

Therefore, the channel structures CH of the non-volatile memory device 1000 according to some embodiments may be made up a plurality of layers. For example, the channel structures CH may include a first channel structure CH1, and a second channel structure CH2 on the first channel structure CH1. The channel structures CH are not limited thereto, and may further include a plurality of channel structures on the second channel structure CH2.

Hereinafter, the channel structures CH are described as being formed by two layers or portions including the first channel structure CH1 and the second channel structure CH2. It is a matter of course that that the description thereof may also be applied to other channel structures made up of the plurality of layers or portions.

In the operations of fabricating the second channel structure CH2 on the first channel structure CH1 during the fabricating process of the non-volatile memory device 1000 according to some embodiments, a misalignment may occur between the first channel structure CH1 and the second channel structure CH2. Misalignment that may occur during the fabricating operations of the channel structures CH will be explained as an example through FIG. 2.

FIG. 2 is an example intermediate stage diagram in the process for explaining the misalignment of the non-volatile memory device for forming the plurality of layers.

Referring to FIG. 2, a second pre-stack PST_2 may be formed on a first pre-stack PST_1 in an intermediate operation of fabricating the non-volatile memory device 1000 according to some embodiments. At this time, the first pre-stack PST_1 may be stacked on the substrate 310 and the common source line 1320 on the substrate 310. More specifically, the first pre-stack PST_1 includes first sacrificial layers $SL_0$ to $SL_k$ and a first insulating layer 330I_1 that are stacked alternately in the second direction (—Z direction).

The first sacrificial layers $SL_0$ to $SL_k$ and the first insulating layer 330I_1 may be formed of a material having a predetermined etching selectivity. For example, the first sacrificial layers $SL_0$ to $SL_k$ may be formed of silicon nitride, and the first insulating layer 330I_1 may be formed of silicon oxide.

The first pre-stack PST_1 includes a first channel hole CHH1 penetrating in the first direction (+Z direction). A sacrificial layer 410a is included inside the first channel hole CHH1. In detail, the first channel hole CHH1 includes a first sacrificial layer 411a that is conformally formed along the side walls. A second sacrificial layer 412a may be included inside the first sacrificial layer 411a.

For example, the first sacrificial layer 411a may include nitrides, and the second sacrificial layer 412a may include polysilicon. However, the embodiment is not limited thereto.

The second pre-stack PST_2 on the first pre-stack PST_1 includes second sacrificial layer $SLk_{+1}$ to $SL_n$ and a second insulating layer 330I_2 that are stacked alternately in the second direction (—Z direction).

The second sacrificial layers $SLk_{+1}$ to $SL_n$ and the second insulating layer 330I_2 may be formed of a material having a predetermined etching selectivity. For example, the second sacrificial layers $SLk_{+1}$ to $SL_n$ may be formed of silicon nitride, and the second insulating layer 330I_2 may be formed of silicon oxide.

In order to form a channel structure having a plurality of layers, a second channel hole CHH2 penetrating the second pre-stack PST_2 in the first direction (+Z direction) may be etched and formed.

At this time, by reason of misalignment between a mask used for etching the first channel hole CHH1 and a mask used for etching the second channel hole CHH2 or the like, the hole CHH1 and the second channel hole CHH2 may not be aligned with each other. The reason why a misalignment between the first channel hole CHH1 and the second channel hole CHH2 occurs is not limited thereto. For example, a position of the second pre-stack PST_2 before the second channel hole CHH2 is generated may be different from a position of the second pre-stack PST_2 when the second channel hole CHH2 is generated. In another example, the position of the mask that generates the second channel hole CHH2 may change randomly.

In detail, a first virtual line IL1 extending in the first direction (+Z direction) from a central part when the first channel hole CHH1 is viewed from the first direction (+Z direction) may deviate from a second virtual line IL2 extending in the first direction (+Z direction) from the central part when the two-channel hole CHH2 is viewed from the first direction (+Z direction). The misalignment between the first channel hole CHH1 and the second channel hole CHH2 will be described through FIG. 3, while being viewed from the upper part of the A-A' cross section.

Figure 3:
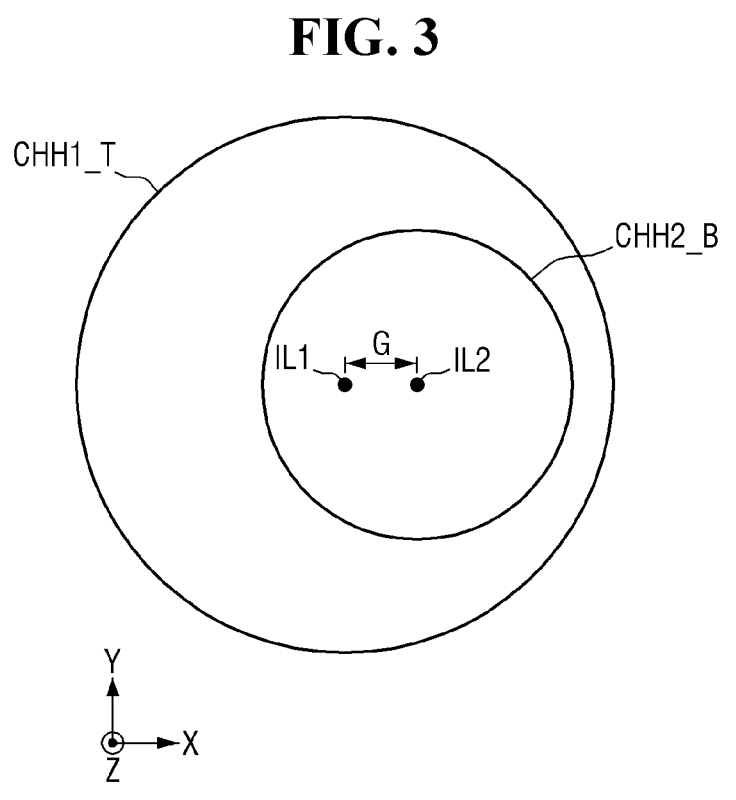

FIG. 3 is an example top view of the A-A' cross section of FIG. 2 as viewed from above.

Referring to FIG. 3, a center IL1 of a top CHH1_T of the first channel hole CHH1 deviates from a center IL2 of a bottom CHH2_B of the second channel hole CHH2 at a regular gap G. That is, the first channel hole CHH1 and the second channel hole CHH2 are misaligned from each other.

Also, when testing the non-volatile memory device from the uppermost part in the second direction (—Z direction), because a size of a bottom CHH2_B of the second channel hole CHH2 is smaller than the size of the top CHH1_T of the first channel hole CHH1, it is not possible to check whether a misalignment between the first channel hole CHH1 and the second channel hole CHH2 occurs.

Referring to FIG. 2 again, in order to remove the second sacrificial layer 412a of the first channel hole CHH1, it is removed through the second channel hole CHH2. However, due to the misalignment between the first channel hole CHH1 and the second channel hole CHH2, the second sacrificial layer 412a of the first channel hole CHH1 may not be completely removed, and at least part of the second sacrificial layer 412a may remain as shown in FIG. 2.

Referring to FIG. 1 again, as described above through FIGS. 2 and 3, in the operation of fabricating the channel structure CH formed of a plurality of layers, if a misalignment between the holes for forming each of the plurality of layers occurs, the reliability of the non-volatile memory device may be reduced.

Therefore, the non-volatile memory device 1000 according to some embodiments may include a monitoring channel structure MCH that grasps or indicates whether a misalignment occurs in order to prevent misalignment between the plurality of layers of the channel structure CH formed of a plurality of layers (e.g., the first channel structure CH1 and the second channel structure CH2) in advance. The monitoring channel structure CH also includes a plurality of layers (e.g., a first monitoring channel structure MCH1 and a second monitoring channel structure MCH2). The number of layers or portions of the monitoring channel structure CH may be the same as the number of layers or portions of the channel structure CH.

The structure and operation for monitoring misalignment of the channel structure CH through the monitoring channel structure MCH included in the non-volatile memory device 1000 according to some embodiments will be described below in detail.

Figure 4:
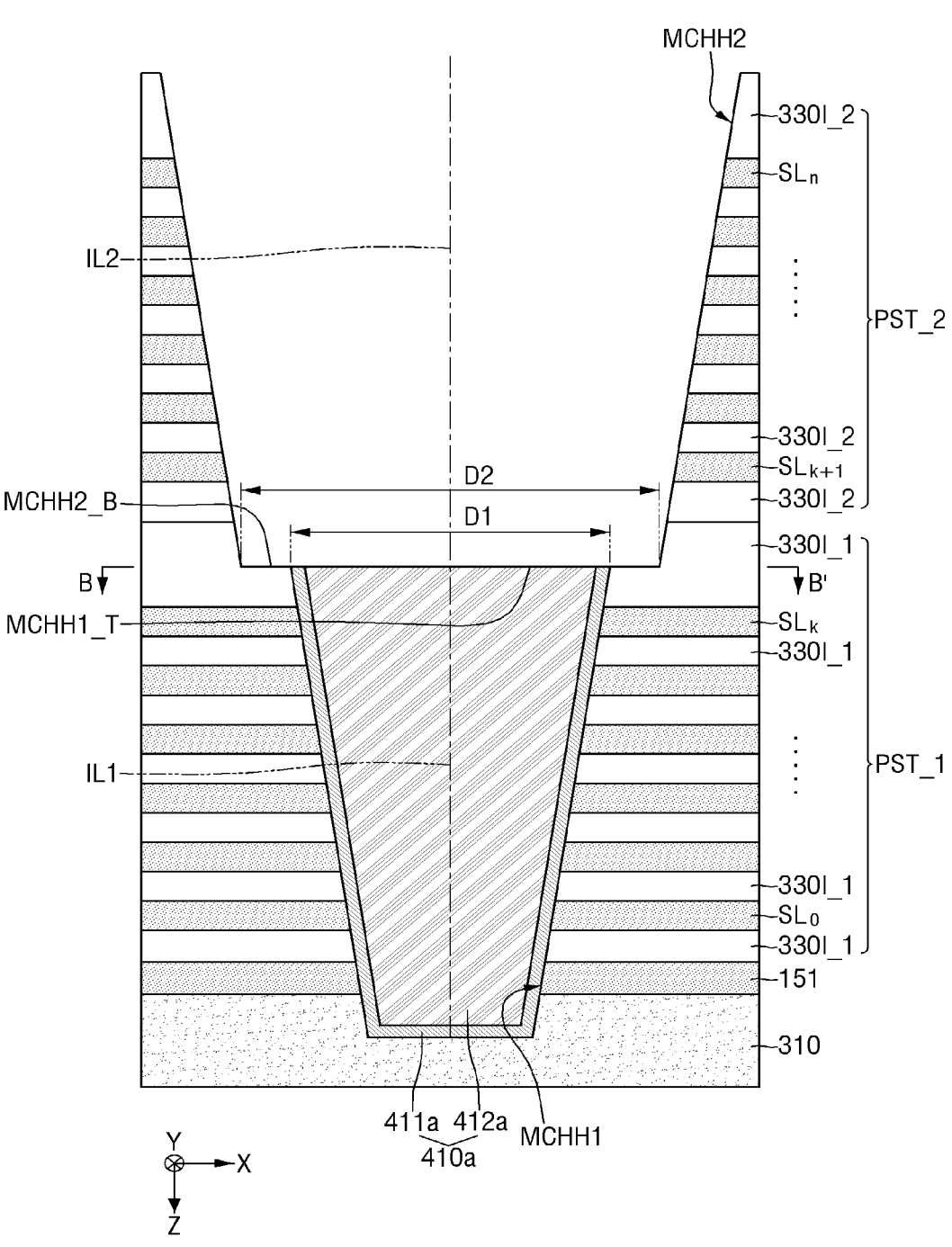
FIG. 4 is an example intermediate stage diagram in the process for explaining the monitoring channel structure according to some embodiments.

FIG. 4 is an example intermediate stage diagram in the process for explaining the monitoring channel structure according to some embodiments. For reference, repeated parts of contents explained through FIG. 2 will be omitted.

In order to form the monitoring channel structure CH, a first monitoring channel hole MCHH1 is formed which penetrates the first pre-stack PST_1 in the second direction (—Z direction). A sacrificial layer 410a as described above through FIG. 2 may be formed inside the first monitoring channel hole MCHH1.

After that, a second monitoring channel hole MCHH2 which penetrates the second pre-stack PST_2 in the second direction (—Z-axis direction) is formed. That is, the second monitoring channel hole MCHH2 may be formed on the sacrificial layer 410a and the first pre-stack PST_1.

At this time, a width D2 of a bottom MCHH2_B of the second monitoring channel hole MCHH2 is greater than the width D1 of the top MCHH1_T of the first monitoring channel hole MCHH1. That is, when the non-volatile memory device according to some embodiments is monitored from the upper part in the second direction (—Z-axis direction), it is possible to more easily monitor a misalignment between the plurality of layers for forming the channel structure. This will be described through FIG. 5 in which B-B' cross section as viewed from above.

Figure 5:
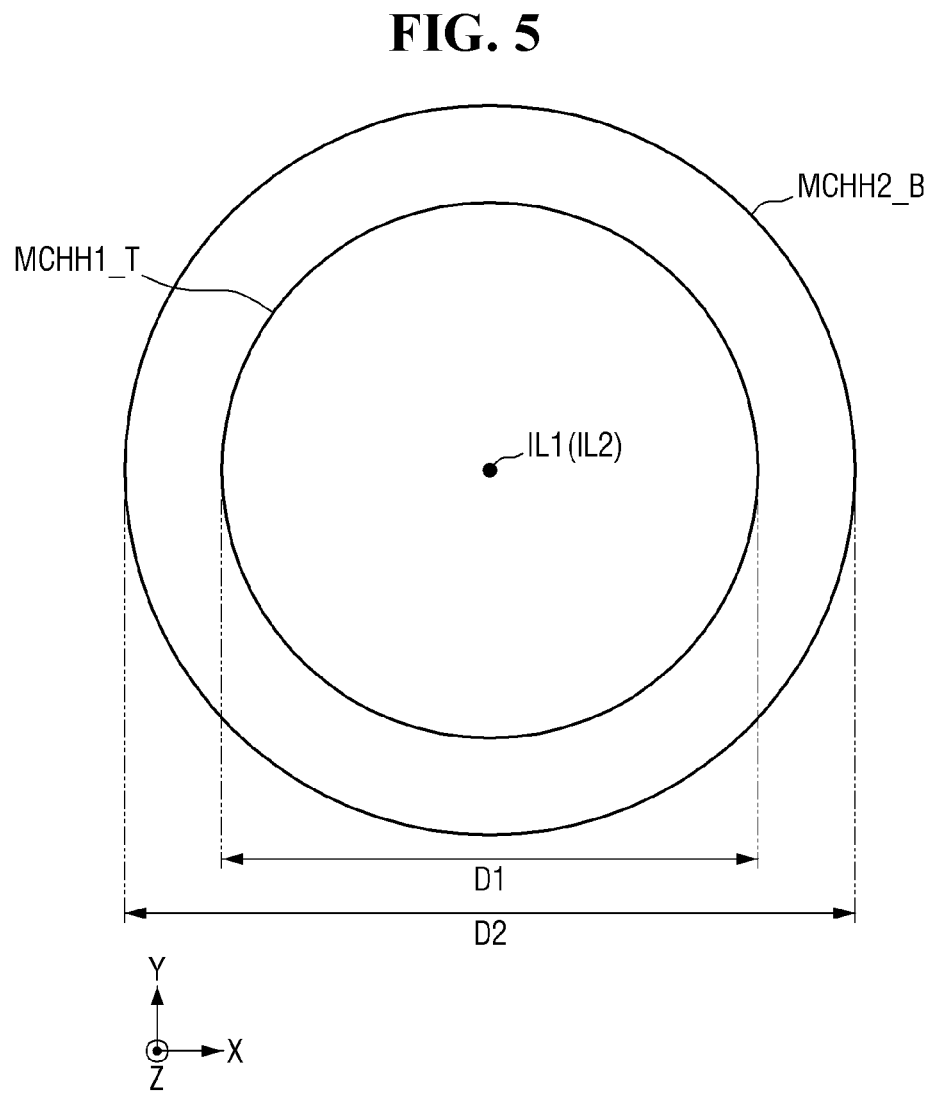

FIG. 5 is an example top view of the B-B' cross section of FIG. 4 as viewed from above.

Referring to FIG. 5, because the width D2 of the bottom MCHH2_B of the second monitoring channel hole MCHH2 is greater than the width D1 of the top MCHH1_T of the first monitoring channel hole MCHH1, it is possible to efficiently monitor the misalignment between the plurality of layers. A case where a misalignment occurs between the plurality of layers for constituting the channel structure will be described, for example, through FIGS. 6 and 7.

Figure 6:
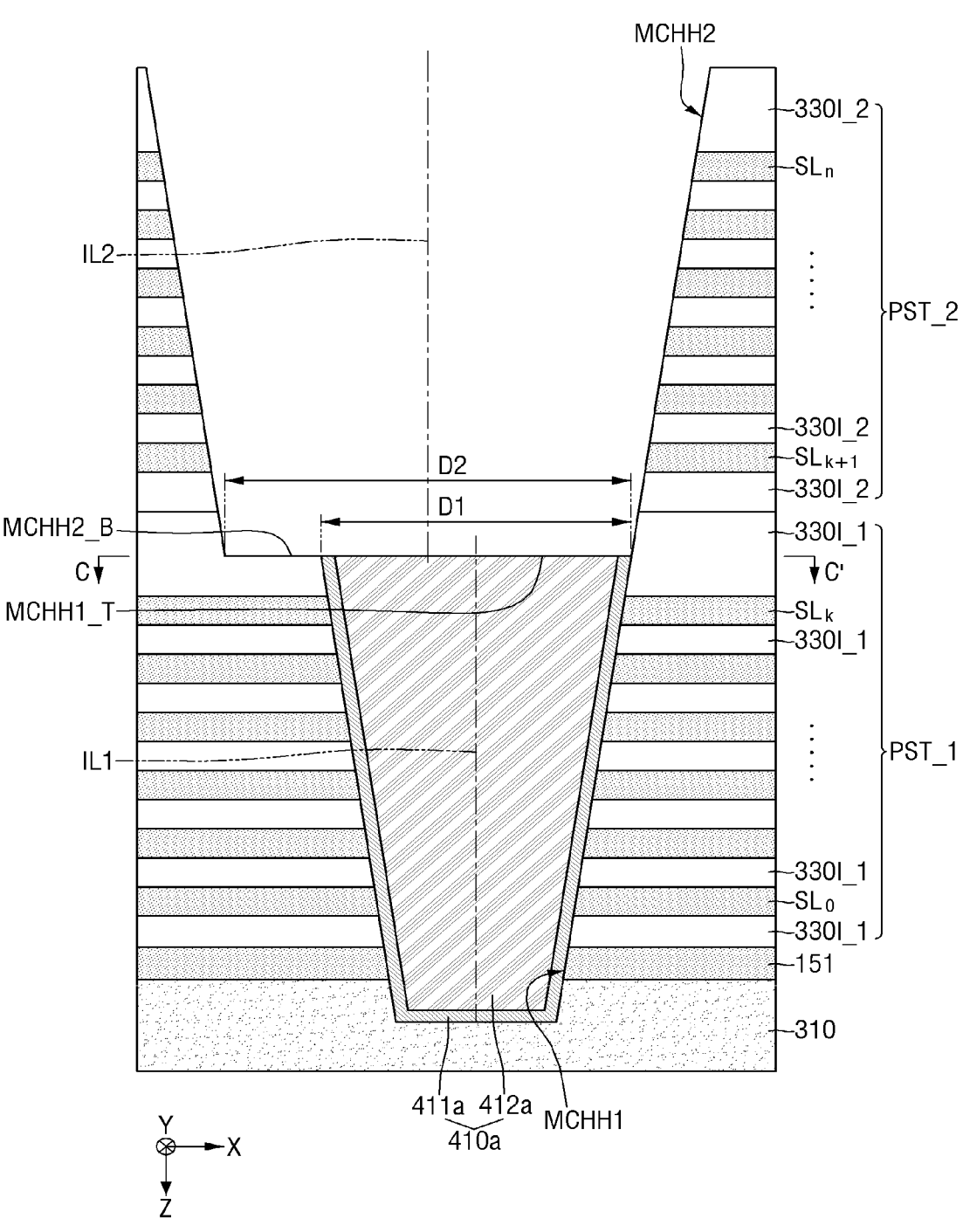
FIG. 6 is an example intermediate stage diagram in the process for explaining the operation of monitoring a misalignment through the monitoring channel structure according to some embodiments.

FIG. 6 is an example intermediate stage diagram in the process for explaining the operation of monitoring a misalignment through the monitoring channel structure according to some embodiments. FIG. 7 is an example top view of a C-C' cross section of FIG. 6 as viewed from above.

Referring to FIGS. 6 and 7, for example, a virtual center line IL2 of the bottom MCHH2_B of the second monitoring channel hole MCHH2 and a virtual center line IL1 of the top MCHH1_T of the first monitoring channel hole MCHH1 deviate from each other at a regular gap G. This makes it possible to monitor an occurrence of misalignment between the plurality of layers of the channel structure.

At this time, because the width D2 of the bottom MCHH2_B of the second monitoring channel hole MCHH2 is greater than the width D1 of the top MCHH1_T of the first monitoring channel hole MCHH1, it is possible to efficiently monitor a misalignment status in which the virtual center line IL2 of the bottom MCHH2_B of the second monitoring channel hole MCHH2 and the virtual center line IL1 of the top MCHH1_T of the first monitoring channel hole MCHH1 deviate from each other.

The non-volatile memory device including the monitoring channel structure according to some embodiments may also have a COP (Cell On Peri) structure. This will be explained through FIG. 8.

Figure 8:
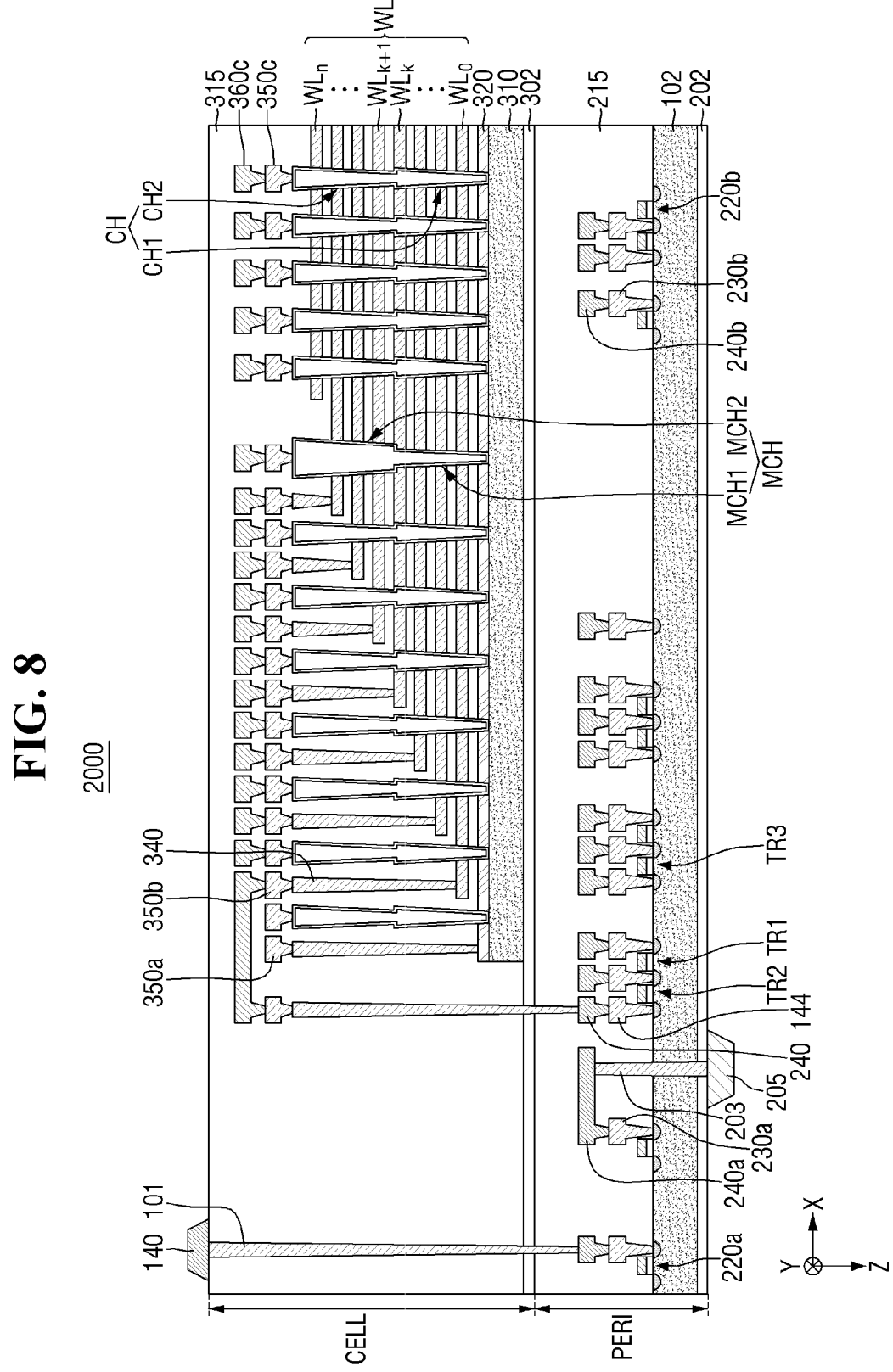
FIG. 8 is an example diagram for explaining another non-volatile memory device according to some embodiments.

FIG. 8 is an example diagram for explaining another non-volatile memory device according to some embodiments.

Referring to FIG. 8, another non-volatile memory device 2000 according to some embodiments may include a peripheral circuit region PERI and a cell region CELL.

The peripheral circuit region PERI may include a second substrate 102, a lower insulating film 202 that covers a lower side of the second substrate 102, an insulating film 215, a plurality of circuit elements TR1, TR2, TR3, 220a and 220b formed on the second substrate 102, first metal layers 144, 230a and 230b connected to each of the plurality of circuit elements TR1, TR2, TR3, 220a and 220b, and second metal layers 240, 240a and 240b formed on the first metal layers 144, 230a and 230b.

In some embodiments, the first to third circuit elements TR1, TR2 and TR3 may provide a decoder circuit in the peripheral circuit region PERI. In some embodiments, the fourth circuit element 220a may provide a logic circuit in the peripheral circuit region PERI. In some embodiments, the fifth circuit element 220b may provide a page buffer in the peripheral circuit region PERI.

Although the first metal layers 144, 230a and 230b and the second metal layers 240, 240a and 240b are shown and described in the present specification, the embodiment is not limited thereto, and at least one or more metal layers may be further formed on the second metal layers 240, 240a and 240b. At least a part of one or more metal layers formed on the second metal layers 240, 240a and 240b may be formed of aluminum or the like having lower resistance than copper for forming the second metal layers 240, 240a and 240b.

In some embodiments, the first metal layers 144, 230a and 230b may be formed of tungsten which has a relatively high resistance, and the second metal layers 240, 240a and 240b may be formed of copper having a relatively low resistance.

The insulating film 215 may be placed on the second substrate 102 to cover the plurality of circuit elements TR1, TR2, TR3, 220a and 220b, the first metal layers 144, 230a and 230b, and second metal layers 240, 240a and 240b.

The cell region CELL may provide at least one memory block. The cell region CELL may include a first substrate 310, an upper insulating film 302 that covers a lower side of the first substrate 310, and a common source line 320. A plurality of word lines $WL_0$ to $WL_n$ may be stacked on the first substrate 310 along the second direction (–Z-axis direction) intersecting the upper side of the first substrate 310.

In some embodiments, a bit line 360c may be electrically connected to a fifth circuit element 220b that provides a page buffer in the peripheral circuit region PERI.

A channel structure CH including a plurality of layers (the first channel structure CH1 and the second channel structure CH2) may be electrically connected to a first metal layer 350c and a second metal layer 360c. For example, the first metal layer 350c may be a bit line contact, and the second metal layer 360c may be a bit line. In some embodiments, the bit line 360c may extend along one direction (e.g., a third direction (Y-axis direction)) parallel to the upper side of the first substrate 1210.

The word lines $WL_0$ to $WL_n$ may extend along a fourth direction (X-axis direction) parallel to the upper side of the first substrate 1210. The word lines $WL_0$ to $WL_n$ may be connected to the plurality of cell contact plugs 340. The word lines $WL_0$ to $WL_n$ and the cell contact plugs 340 may be connected to each other with pads provided by extension of at least some of the word lines $WL_0$ to $WL_n$ with different lengths from each other. The first metal layers 350a and 350b may be connected to the upper part of the cell contact plugs 340 connected to the word lines $WL_0$ to $WL_n$.

A second I/O pad 140 may be placed on the upper insulating film 315. The second I/O pad 140 may be connected to at least one of the plurality of circuit elements TR1, TR2, TR3, 220a and 220b placed in the peripheral circuit region PERI through the second I/O contact plug 101.

On the other hand, a first I/O pad 205 may be placed below the lower insulating film 202. A lower insulating film 202 that covers the lower side of the first substrate 102 may be formed below the first substrate 102, and the first I/O pad 205 may be formed on the lower insulating film 202. The first I/O pad 205 is connected to at least one of the plurality of circuit elements TR1, TR2, TR3, 220a and 220b placed in the peripheral circuit region PERI through the first I/O contact plug 203, and may be separated from the first substrate 102 by the lower insulating film 202. A side insulating film is placed between the first I/O contact plug 203 and the first substrate 102, and may electrically separate the first I/O contact plug 203 and the first substrate 102.

FIGS. 9 to 14 are example intermediate stage diagrams for explaining process operations for fabricating the monitoring channel structure according to some embodiments.

Figure 9:
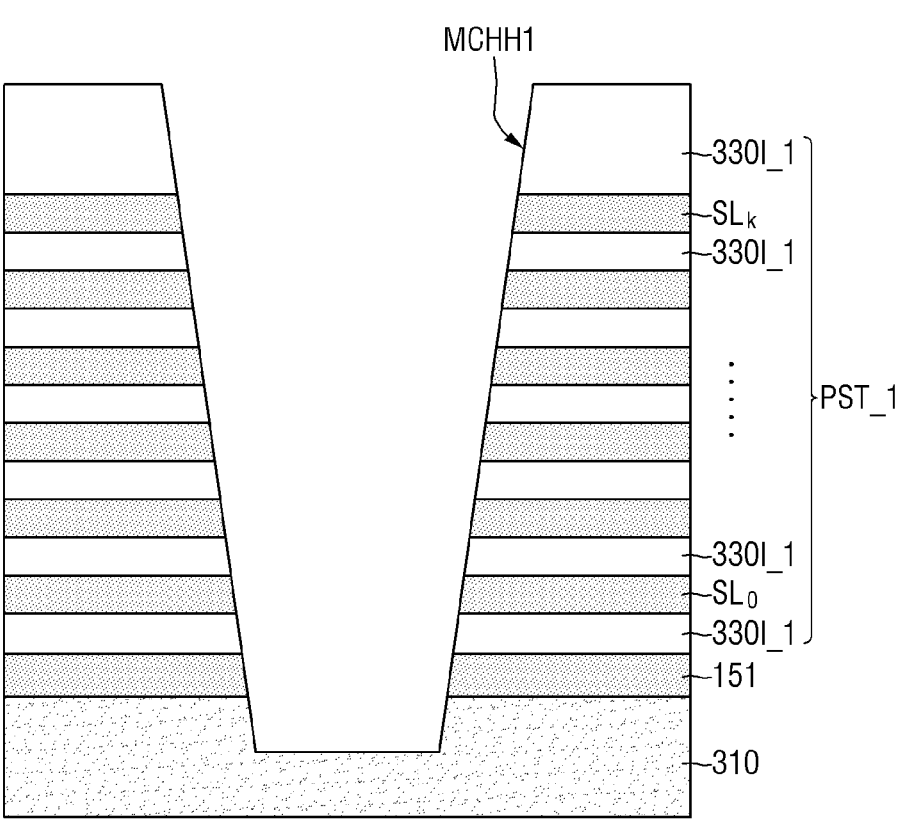
FIGS. 9, 10, 11, 12, 13, and 14 are example intermediate stage diagrams for explaining the process operations of the monitoring channel structure according to some embodiments.
Figure 9:
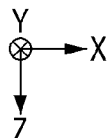

First, referring to FIG. 9, in the method of fabricating the non-volatile memory device according to some embodiments, a substrate 310, a sacrificial film 151 on the substrate 310, and a plurality of dielectric layers 330I_1 and a plurality of sacrificial layers $SL_0$ to $SL_k$ that are alternately stacked on the sacrificial film 151 are formed.

After that, the substrate 310, the sacrificial film 151 on the substrate 310, and the plurality of dielectric layers 330I_1 and the plurality of sacrificial layers $SL_0$ to $SL_k$ that are alternately stacked on the sacrificial film 151 are etched to form the first monitoring channel hole MCHH1.

The plurality of dielectric layers 3301_1 and the plurality of sacrificial layers $SL_0$ to $SL_k$ that are alternately stacked on the sacrificial film 151 form a first pre-stack PST_1.

Figure 10:
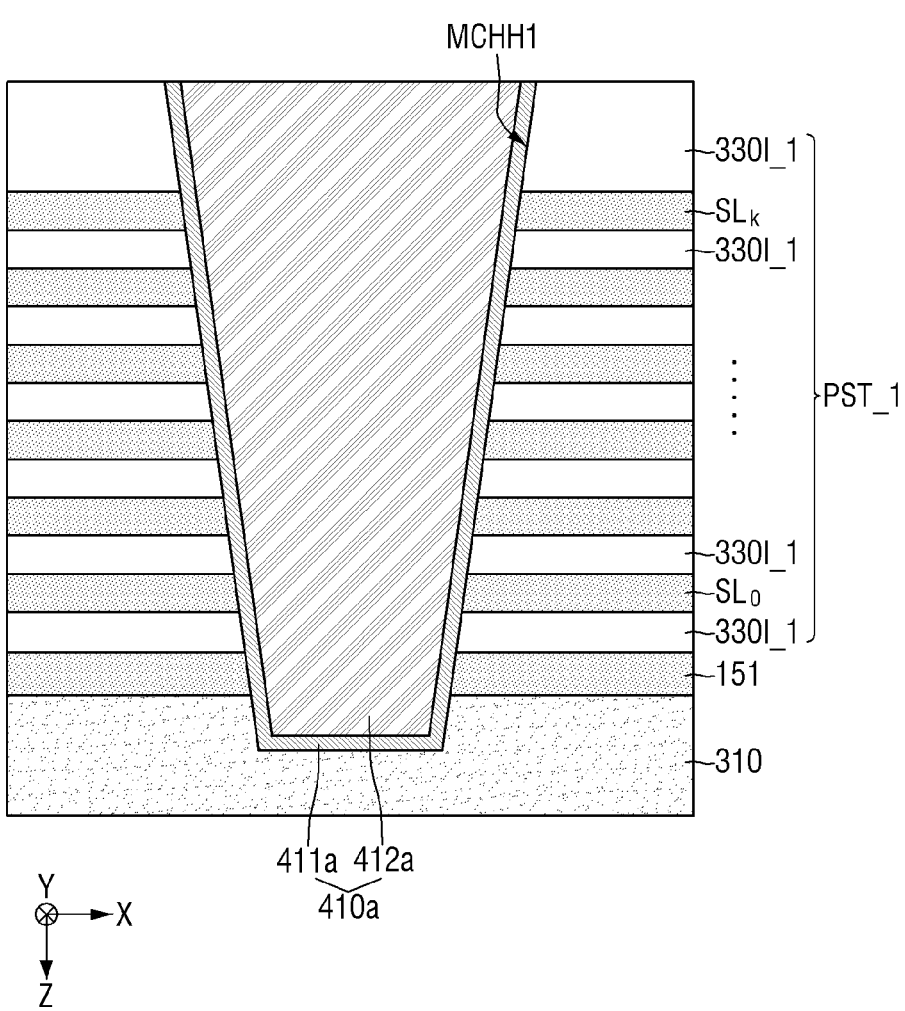

After that, referring to FIG. 10, a first sacrificial layer 411a is conformally formed along the side walls of the first monitoring channel hole MCHH1. After that, the second sacrificial layer 412a is filled inside the first sacrificial layer 411a. The first sacrificial layer 411a and the second sacrificial layer 412a may be collectively referred to as the sacrificial layer 410a.

Figure 11:
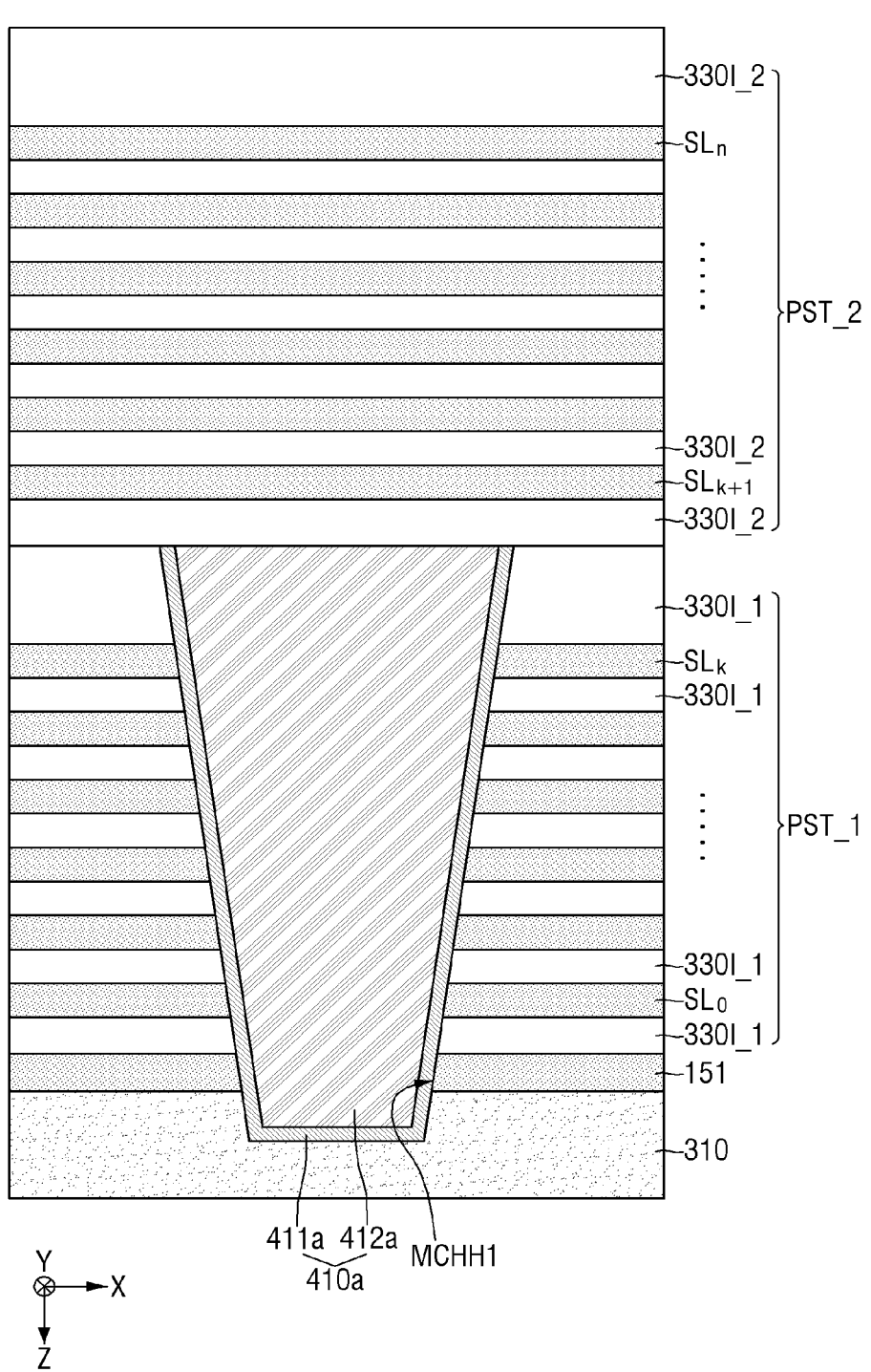

After that, referring to FIG. 11, a second pre-stack PST_2 is formed on the first pre-stack PST_1. The second pre-stack PST_2 includes a second dielectric layer 330I_2 and a plurality of sacrificial layers $SL_{k+1}$ to $SL_n$ that are alternately stacked on the first pre-stack PST_1.

Figure 12:
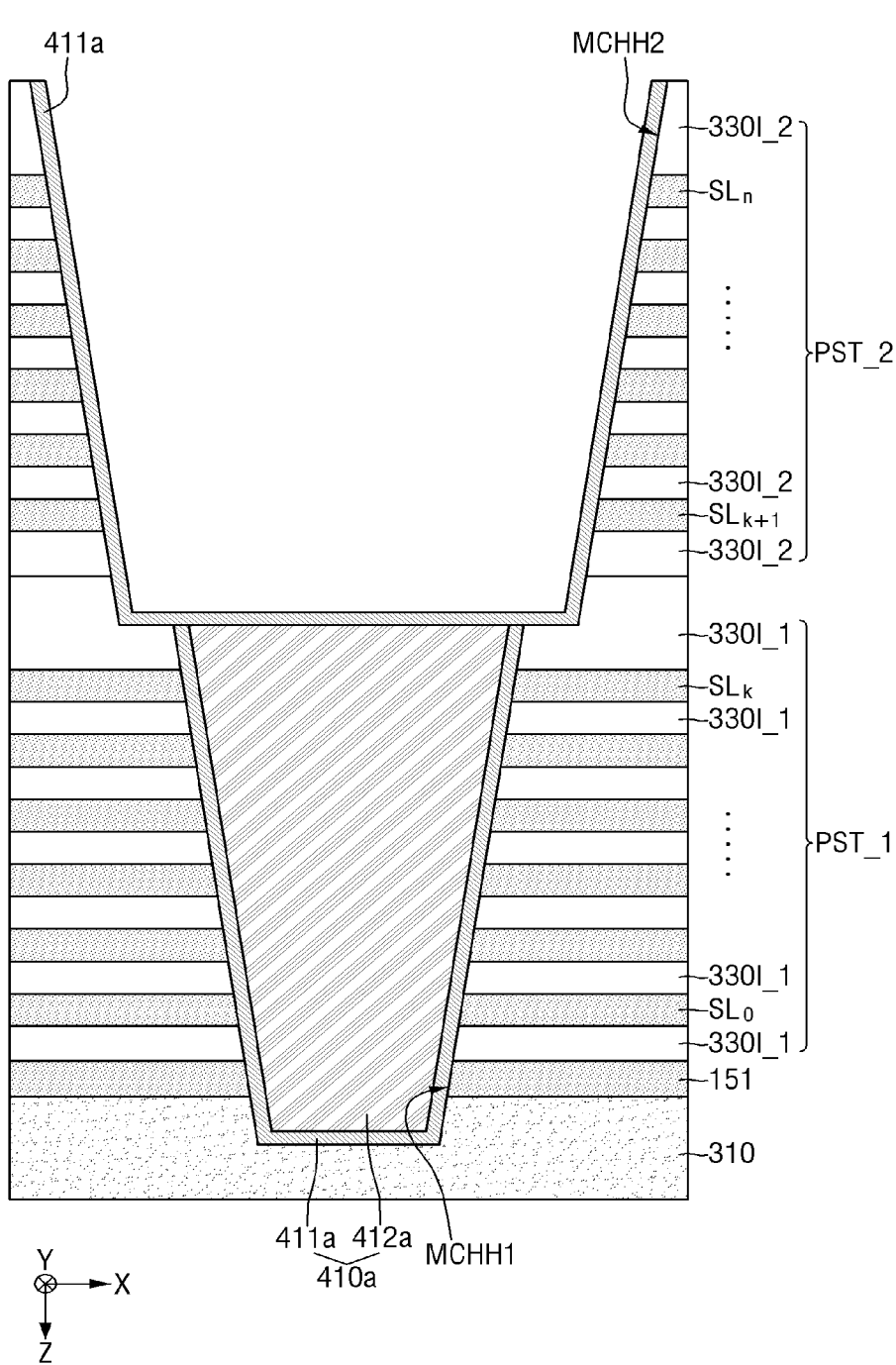

After that, referring to FIG. 12, the second pre-stack PST_2 is etched to form the second monitoring channel hole MCHH2. Explanation will be provided referring to FIG. 4 together. Etching is performed so that the width D2 of the bottom MCHH2_B of the second monitoring channel hole MCHH2 is greater than the width D1 of the top MCHH1_T of the first monitoring channel hole MCHH1.

Figure 13:
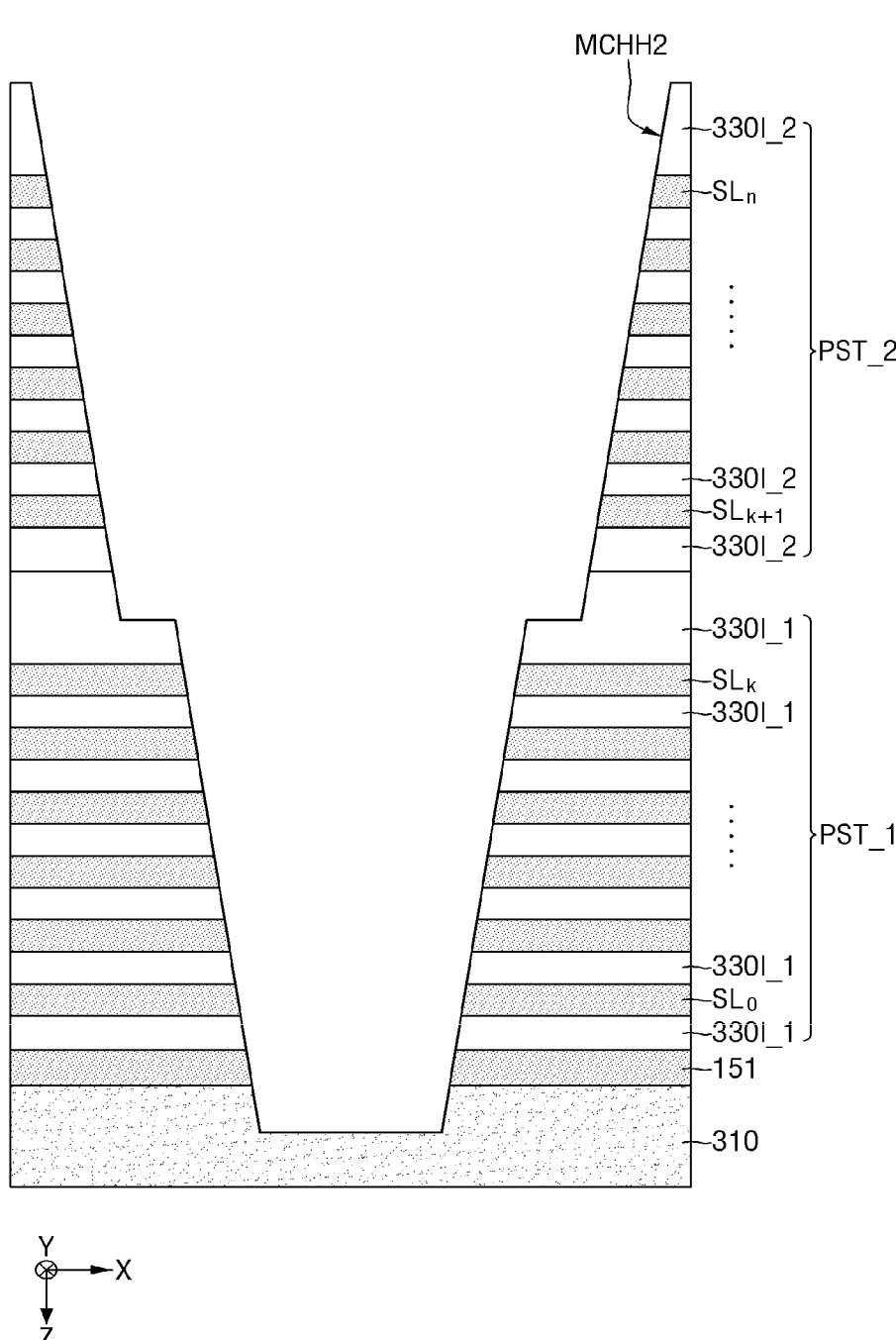

After that, referring to FIG. 13, the sacrificial layer 410a is removed.

Figure 14:
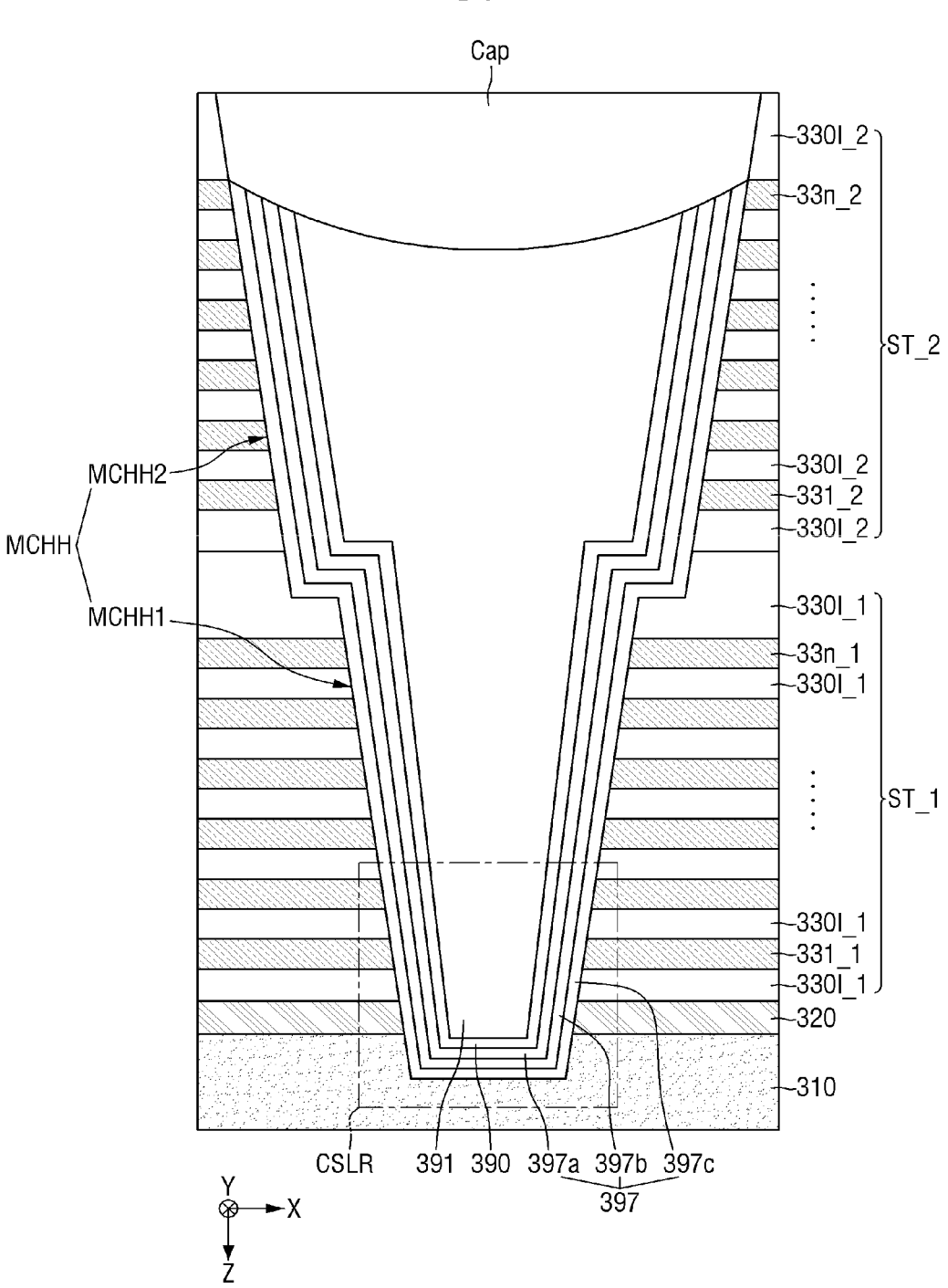

After that, referring to FIG. 14, the monitoring channel structure CH is formed. Also, a plurality of conductive patterns 331_1 to 33n_1, and 331_2 to 33n_2 are formed through a replacement process.

In detail, a data storage layer 397, a channel layer 390, and a buried insulating layer 391 are formed sequentially along the side walls of the first monitoring channel hole MCHH1 and the second monitoring channel hole MCHH2 formed in FIG. 13.

At this time, the data storage layer 397 includes a blocking insulating film 397c, a charge storage film 397b, and a tunnel insulating film 397a that are formed sequentially along the side walls of the first monitoring channel hole MCHH1 and the second monitoring channel hole MCHH2 formed in FIG. 13.

Although the channel layer 390 is shown as a stacked cup shape, this is only an example, and the channel layer 390 may also have various shapes such as a cylindrical shape, a square tubular shape, a solid filler shape, and a single cup shape. The channel layer 390 may include, for example, but is not limited to, semiconductor materials such as single crystal silicon, polycrystalline silicon, organic semiconductor matter and carbon nanostructure.

The data storage layer 397 may be interposed between the channel layer 390 and the plurality of conductive patterns 331_1 to 33n_1, and 331_2 to 33n_2. For example, the data storage layer 397 may extend along the side faces of the channel layer 390.

In some embodiments, the data storage layer 397 may be formed of multiple films. For example, the data storage layer 397 may include a tunnel insulating film 397a, a charge storage film 397b and a blocking insulating film 397c which are sequentially stacked on the channel layer 390. The tunnel insulating film 397a may include, for example, a silicon oxide or a high dielectric constant material (e.g., aluminum oxide ($Al_2O_3$) and hafnium oxide ($HfO_2$)) having a higher dielectric constant than silicon oxide. The charge storage film 397b may include, for example, silicon nitride. The blocking insulating film 397c may include, for example, a silicon oxide or a high dielectric constant material having a higher dielectric constant than silicon oxide.

In some embodiments, the monitoring channel structure MCH may further include a buried insulating layer 391. The buried insulating layer 391 may be formed to fill the inside of the cup-shaped channel layer 390. The buried insulating layer 391 may include, but is not limited to, insulating materials such as silicon oxides.

A capping film Cap may be provided on the second monitoring channel structure MCH2 opposite the bottom thereof. For example, the capping film Cap may be provided on the buried insulating layer 391. A bottom of the capping film Cap (e.g., adjacent a top of the buried insulating layer 391) may have a curved shape.

The common source line 320 may be formed to be electrically connected to the channel layer 390 of the monitoring channel structure MCH.

Figure 15:
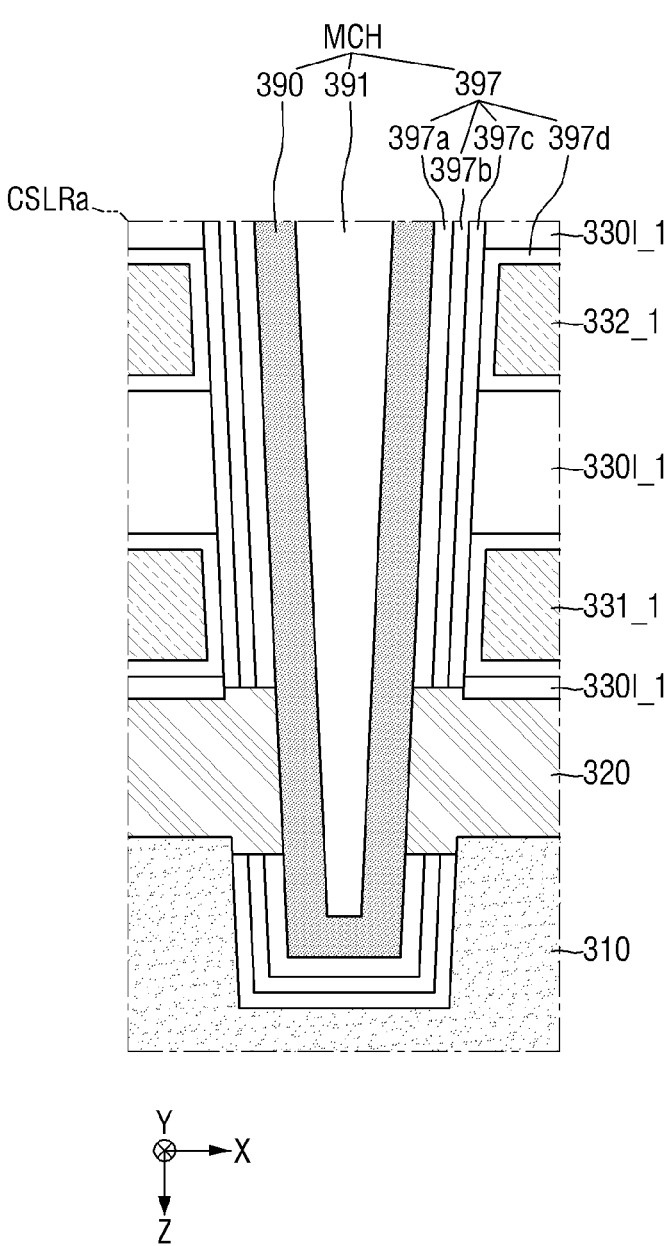
FIGS. 15 and 16 are example enlarged views of a region CSLR of FIG. 14.
Figure 16:
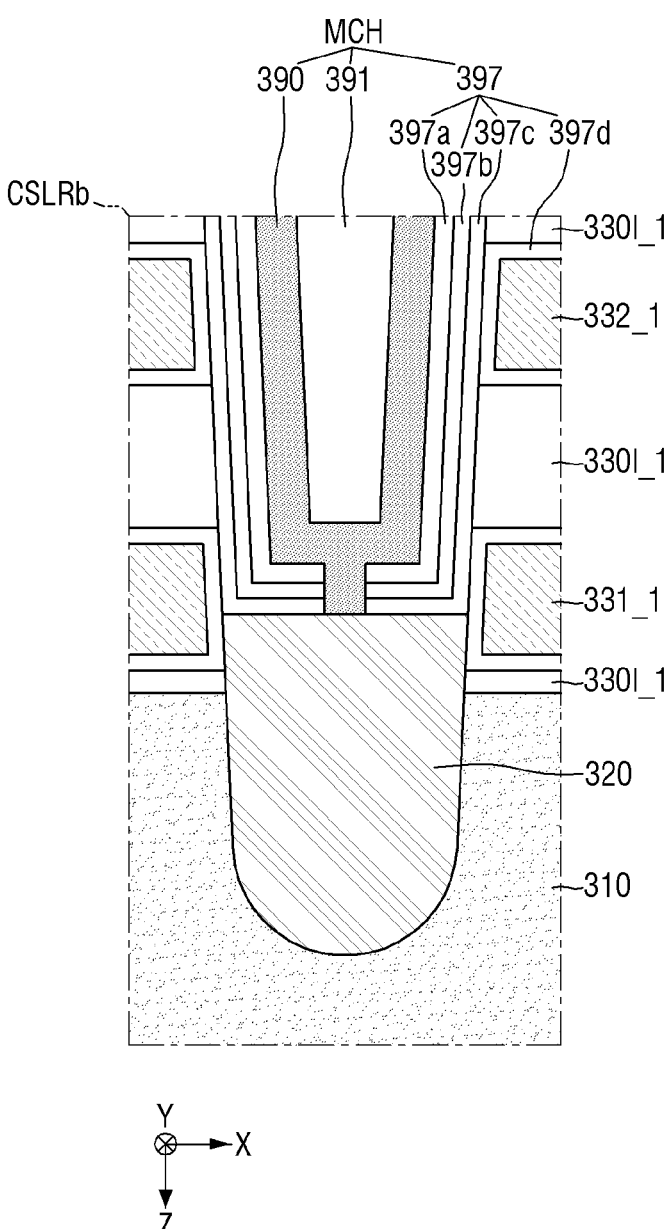

A form in which the common source line 320 is electrically connected to the channel layer 390 of the monitoring channel structure MCH may be provided in various forms as shown in FIGS. 15 and 16.

FIGS. 15 to 16 are example enlarged views of a region CSLR of FIG. 14.

Referring to FIG. 15, in some embodiments, the monitoring channel structure MCH may penetrate the common source line 320 and be buried in the second substrate 310. The common source line 320 may penetrate a part of the data storage layer 397 and may be electrically connected to and contacting the side faces of the channel layer 390.

Alternatively, referring to FIG. 16, in some embodiments, at least a part of the common source line 320 may be buried inside the second substrate 310. The common source line 320 may be formed, for example, by a selective epitaxial growth (SEG) process from the second substrate 310. The monitoring channel structure MCH may penetrate a part of the information storage film 397 and be electrically connected to and contacting the upper side of the common source line 320.

Referring to FIGS. 15 and 16, the data storage layer 397 of the non-volatile memory device according to some embodiments may further include a gate insulating film 397*d* that extends along the surfaces of each of the plurality of conductive patterns 331_1 to 33*n*_1, and 331_2 to 33*n*_2.

FIGS. 17 to 20 are example top views for explaining a non-volatile memory device according to some embodiments.

Figure 17:
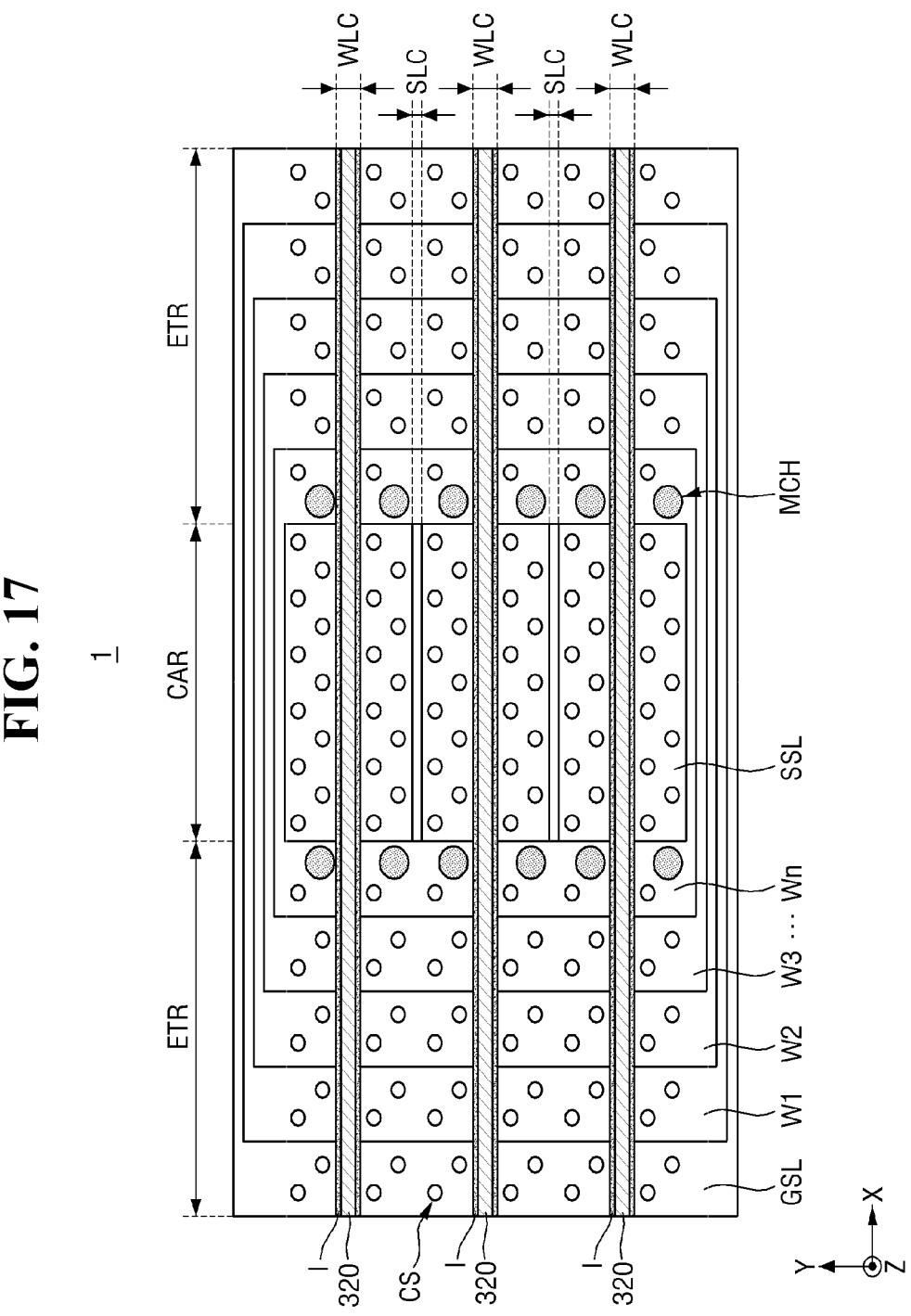
FIGS. 17, 18, 19, and 20 are example top views for explaining a non-volatile memory device according to some embodiments.

Referring to FIG. 17, the non-volatile memory device 1 according to some embodiments may include a cell array region CAR and an extension region ETR.

A memory cell array including a plurality of memory cells may be formed in the cell array region CAR. The memory cell array may include a plurality of memory cells, a plurality of word lines WL1 to WLn electrically connected to each of the memory cells, and a plurality of bit lines (not shown). For example, a mold structure, a plurality of channel structures CH, and bit lines may be formed in the cell array region CAR.

The extension region ETR may be placed around the cell array region CAR. At least some each of a plurality of gate electrodes (e.g., a ground selection line GSL, a plurality of word lines WL1 to WLn and a string selection line SSL), a mold structure, and a plurality of channel structures CH may be stacked in the extension region ETR in the form of a step. Further, a plurality of pad electrodes (not shown) connected to a plurality of gate electrodes (e.g., the ground selection line GSL, the plurality of word lines WL1 to WLn and the string selection line SSL) may be formed in the extension region ETR. For example, some of the plurality of pad electrodes (not shown) may be electrically connected to some of the plurality of pad electrodes formed in the page buffer.

Further, the above-mentioned monitoring channel structures MCH may be formed in the extension region ETR. The monitoring channel structures MCH may be formed at the periphery or places of the extension region ETR closest to the cell array region CAR. When the monitoring channel structures MCH are placed at the places of the extension region ETR closest to the channel structures CH of the cell array region CAR, the accuracy of determination of the misalignment of the channel structures CH may be further enhanced.

The plurality of channel structures CH in the non-volatile memory device 1 or the plurality of gate electrodes (e.g., the ground selection line GSL, and the plurality of word lines WL1 to WLn or the string selection line SSL) may be separated by a word line cut region WLC. That is, the word line cut region WLC extends in the direction Y intersecting the bit line (not shown), and may cut the mold structure. A common source line spacer I may be formed along the side walls inside the word line cut region WLC. The common source line spacer I may be made up of a silicon oxide, a silicon nitride or a silicon oxynitride.

Further, by forming the inside of the word line cut region WLC and the common source line spacer I with a conductive material, a common source line CSL including a conductive pattern may be formed. The conductive material may include, but is not limited to, a metal material such as tungsten (W), aluminum (Al) or copper (Cu).

Some (e.g., the string selection line SSL) of the plurality of gate electrodes (e.g., the ground selection line GSL, the plurality of word lines WL1 to WLn or the string selection line SSL) of the non-volatile memory device 1 may be cut in the third direction Z to form a string selection line cut region SLC. The string selection line cut region SLC may be filled with an insulating film (not shown).

Figure 18:
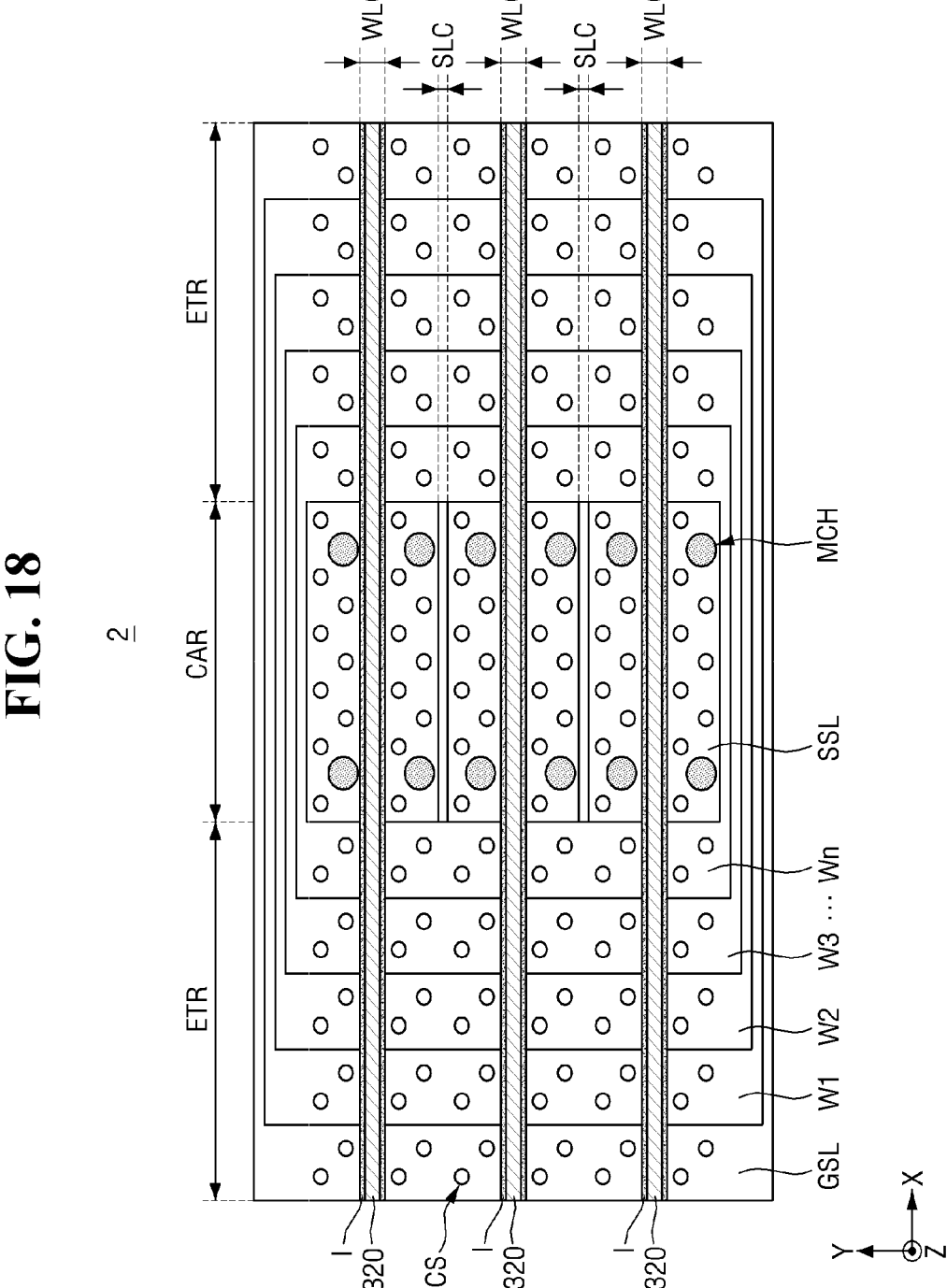

Referring to FIG. 18, the non-volatile memory device 2 according to some embodiments may place the monitoring channel structure MCH in the cell array region CAR.

At this time, the accuracy of determination of misalignment of the channel structures CH through the monitoring channel structures MCH may be further enhanced. However, the data storage capacity of the cell array region CAR may be reduced, by utilizing a part of the channel structures CH of the cell array region CAR for monitoring.

Figure 19:
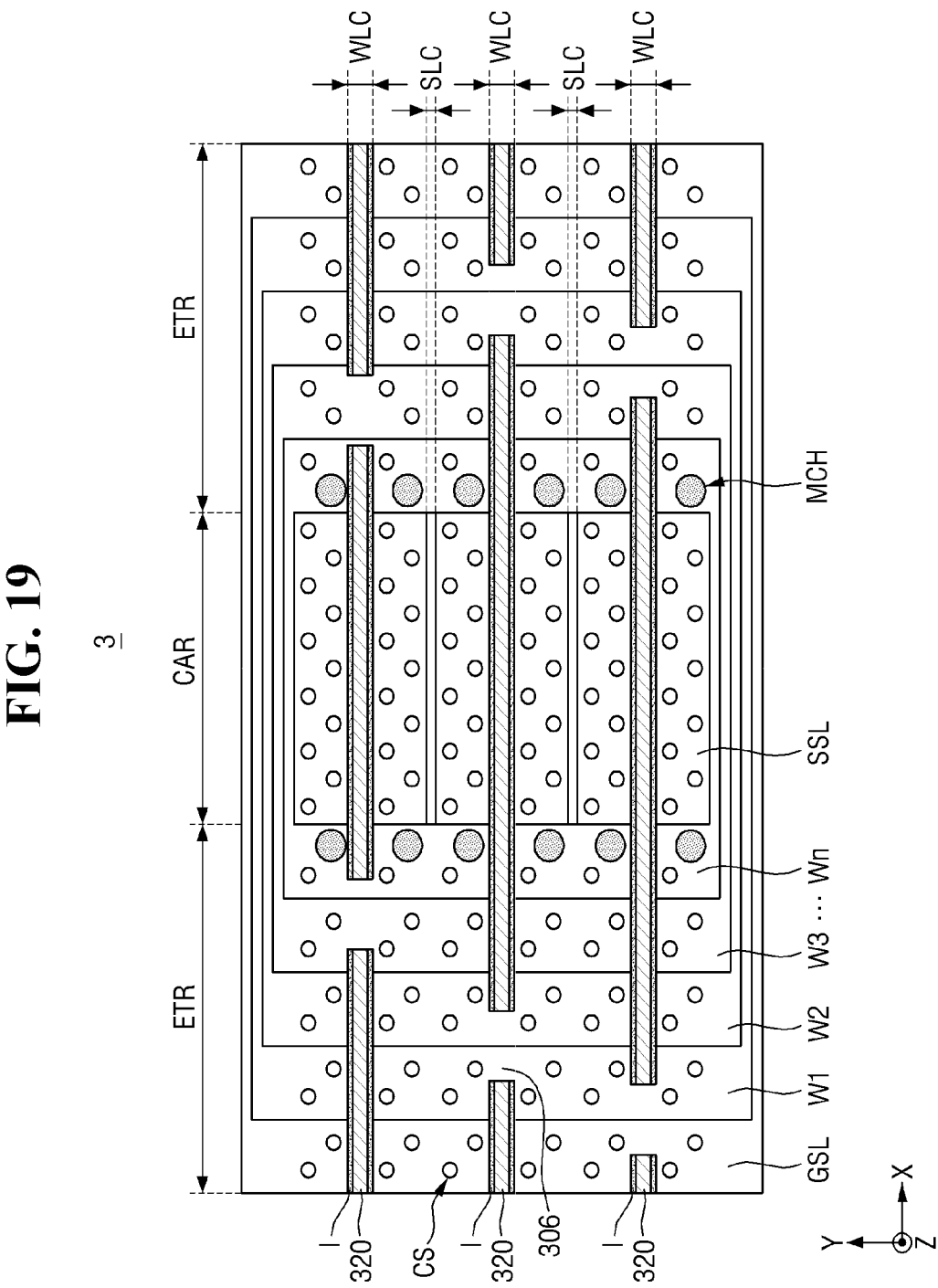

Referring to FIG. 19, unlike FIGS. 17 and 18, a region in which the common source line CSL is cut in the extension region ETR of the non-volatile memory device 3 according to some embodiments may have an H-CUT shape.

Figure 20:
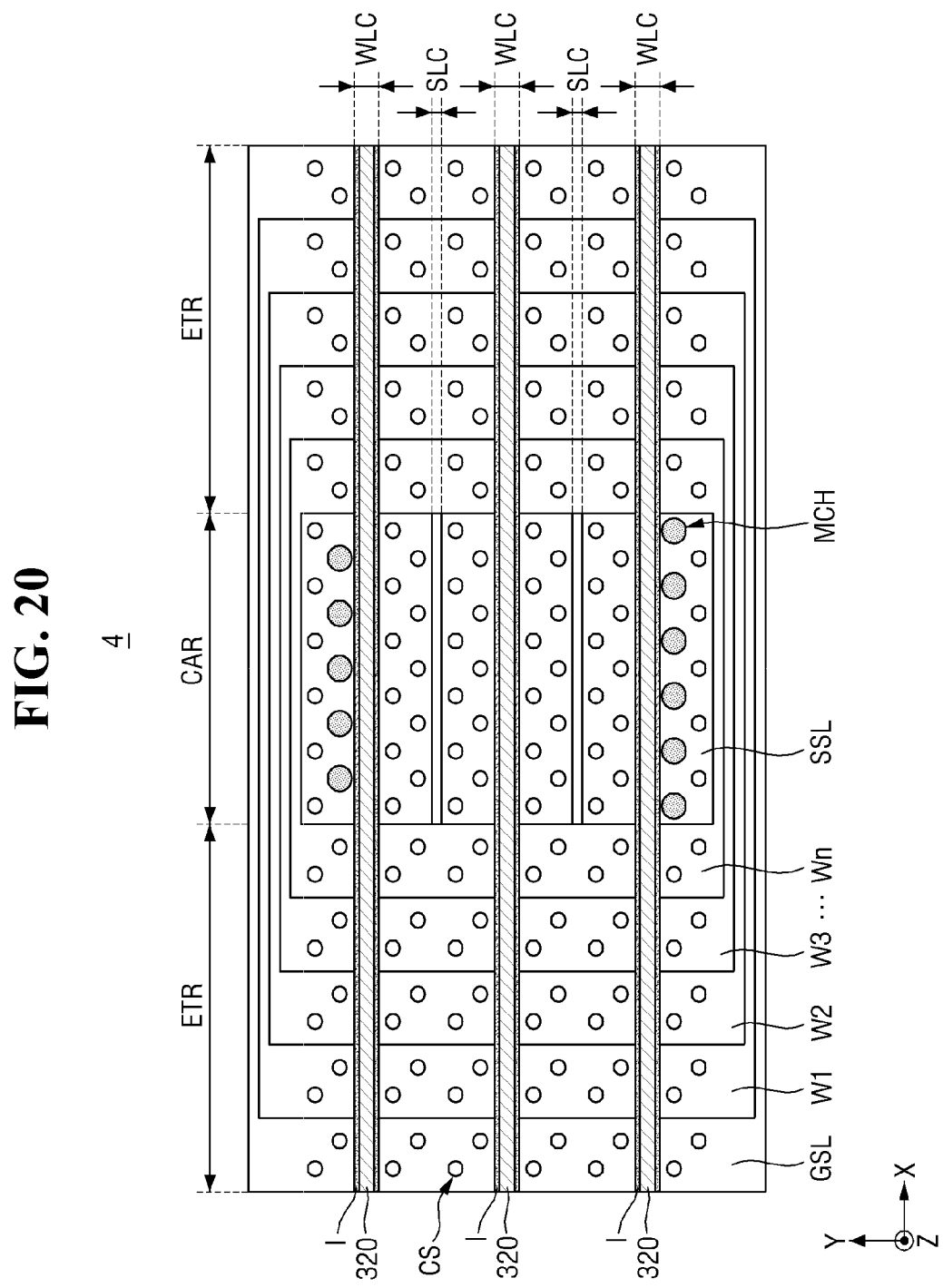

The monitoring channel structure MCH is not limited thereto, and may also be placed in the cell array region CAR. This will be explained through FIG. 20. Referring to FIG. 20, in a non-volatile memory device 4 according to some embodiments, a monitoring channel structure MCH may be formed in the cell array region CAR. A position at which the monitoring channel structure MCH is placed in the cell array region CAR is not limited to this drawing.

Figure 21:
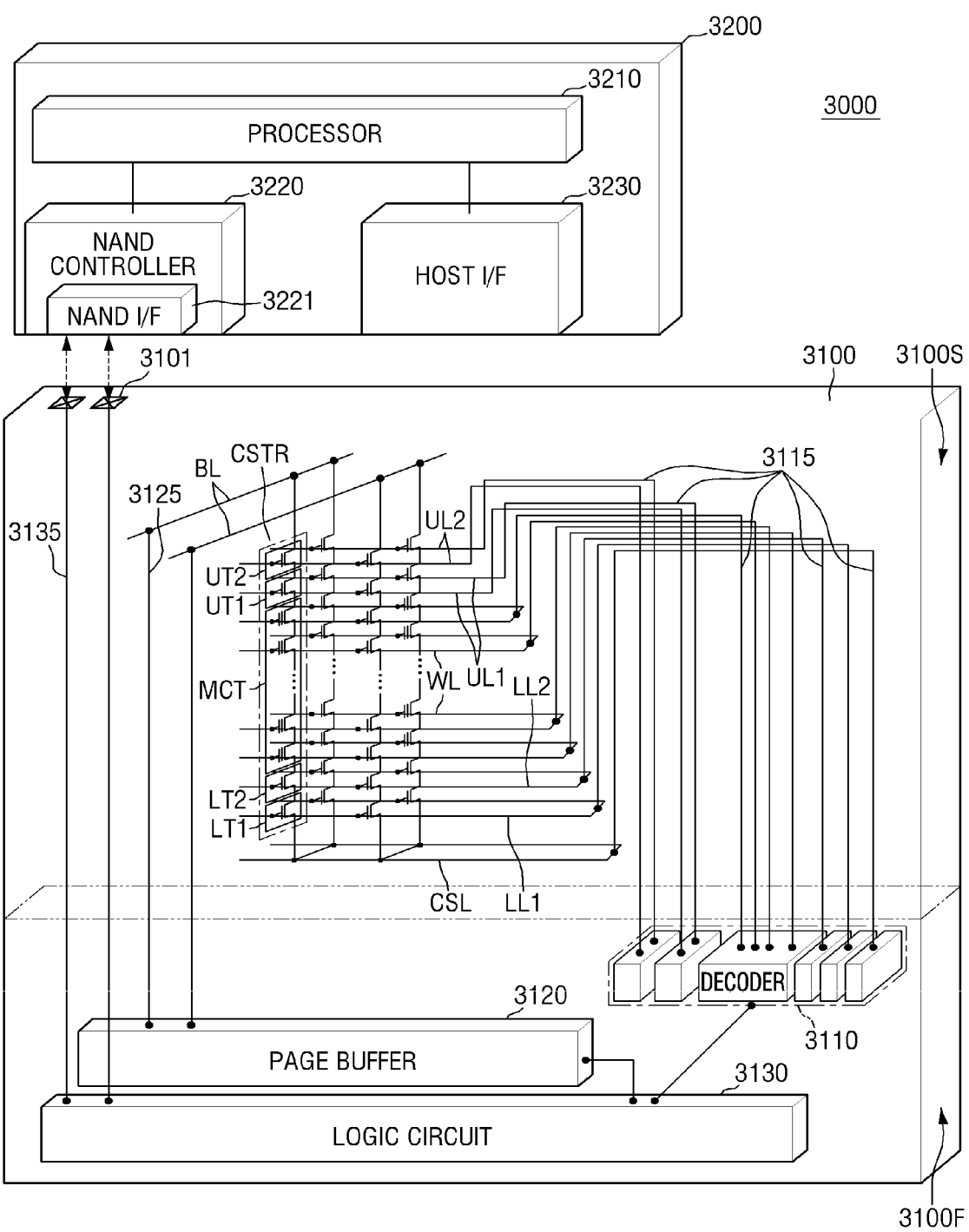
FIG. 21 is an example diagram for explaining an electronic system including a non-volatile memory device according to some embodiments.

FIG. 21 is an example diagram for explaining an electronic system including a non-volatile memory device according to some embodiments.

Referring to FIG. 21, an electronic system 3000 according to some embodiments may include a non-volatile memory device 3100, and a controller 3200 electrically connected to the non-volatile memory device 3100. The electronic system 3000 may be a storage device including single or multiple non-volatile memory devices 3100, or an electronic device including a storage device. For example, the electronic system 3000 may be a SSD device (solid state drive device) including single or multiple non-volatile memory devices 3100, a USB (Universal Serial Bus), a computing system, a medical device or a communication device.

The non-volatile memory device 3100 may be, for example, the NAND flash memory device described above referring to FIGS. 1 to 19. The non-volatile memory device 3100 may include a first structure 3100F, and a second structure 3100S on the first structure 3100F. In the example embodiments, the first structure 3100F may also be placed next to the second structure 3100S. The first structure 3100F may be a peripheral circuit structure that includes a decoder circuit 3110, a page buffer 3120, and a logic circuit 3130. The second structure 3100S may be a memory cell structure that includes a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 3100S, each memory cell string CSTR may include lower transistors LT1 and LT2 adjacent to the common source line CSL, upper transistors UT1 and UT2 adjacent to the bit line BL, and a plurality of memory cell transistors MCT placed between the lower transistors LT1 and LT2 and the upper transistors UT1 and UT2. The number of lower transistors LT1 and LT2 and the number of upper transistors UT1 and UT2 may be variously changed depending on the embodiments.

In the example embodiments, the upper transistors UT1 and UT2 may include a string selection transistor, and the lower transistors LT1 and LT2 may include a ground selection transistor. The gate lower lines LL1 and LL2 may be the gate electrodes of the lower transistors LT1 and LT2, respectively. The word lines WL may be gate electrodes of the memory cell transistor MCT, and the gate upper lines UL1 and UL2 may be gate electrodes of the upper transistors UT1 and UT2, respectively.

In the example embodiments, the lower transistors LT1 and LT2 may include a lower erasure control transistor LT1 and a ground selection transistor LT2 that are connected is series. The upper transistors UT1 and UT2 may include a string selection transistor UT1 and an upper erasure control transistor UT2 that are connected in series. At least one of the lower erasure control transistor LT1 and the upper erasure control transistor UT1 may be used for an erasure operation for removing the data stored in the memory cell transistors MCT, using a gate induce drain leakage (GIDL) phenomenon.

The common source line CSL, the first and second gate lower lines LL1 and LL2, the word lines WL, and the first and second gate upper lines UL1 and UL2 may be electrically connected to the decoder circuit 3110 through first connection wirings 3115 that extend from the inside of the first structures 3100F to the second structure 3100S. The bit lines BL may be electrically connected to the page buffer 3120 through second connection wirings 3125 that extend from the inside of the first structure 310F to the second structure 3100S.

In the first structure 3100F, the decoder circuit 3110 and the page buffer 3120 may execute the control operation on at least one selection memory cell transistor among the plurality of memory cell transistors MCT. The decoder circuit 3110 and the page buffer 3120 may be controlled by the logic circuits 3130. The semiconductor device 3000 may communicate with the controller 3200 through an I/O pad 3101 that is electrically connected to the logic circuit 3130. The I/O pad 3101 may be electrically connected to the logic circuit 3130 through an I/O connection wiring 3135 extending from the inside of the first structure 3100F to the second structure 3100S.

The controller 3200 may include a processor 3210, a NAND controller 3220, and a host interface 3230. According to the embodiments, the electronic system 3000 may include a plurality of semiconductor memory devices 3100, and in this case, the controller 3200 may control the plurality of semiconductor memory devices 3100.

The processor 3210 may control the overall operations of the electronic system 3000 including the controller 3200. The processor 3210 may operate according to a predetermined firmware, and may control the NAND controller 3220 to access the non-volatile memory device 3100. The NAND controller 3220 may include a NAND interface 3221 that processes communication with the non-volatile memory device 3100. Control commands for controlling the non-volatile memory device 3100, data to be recorded in the memory cell transistors MCT of the non-volatile memory device 3100, data to be read from the memory cell transistors MCT of the non-volatile memory device 3100, and the like may be transmitted through the NAND interface 3221. The host interface 3230 may provide a communication function between the electronic system 3000 and an external host. When receiving the control command from the external host through the host interface 3230, the processor 3210 may control the non-volatile memory device 3100 in response to the control command.

Figure 22:
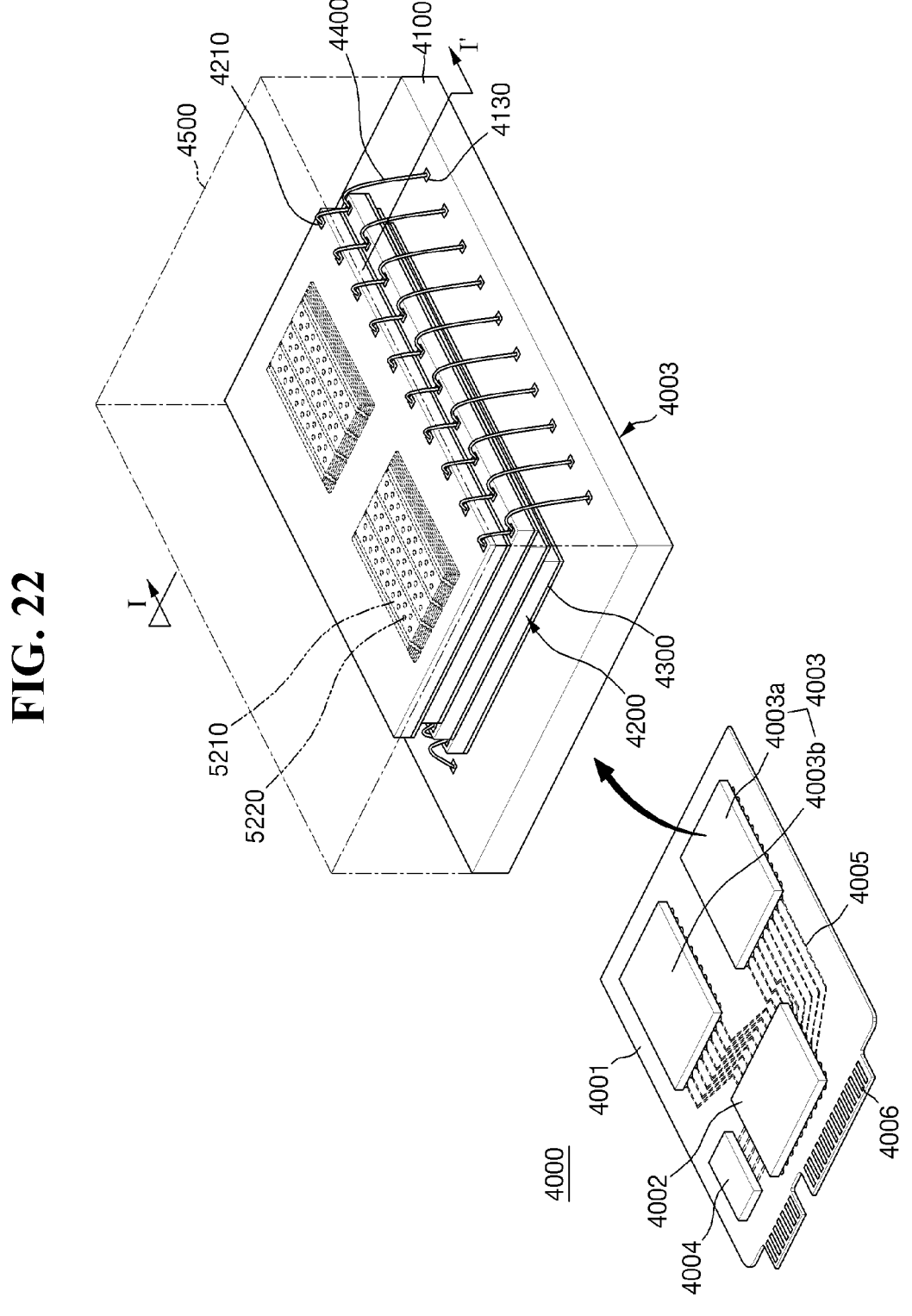
FIG. 22 is an example perspective view for explaining an electronic system including the non-volatile memory device according to some embodiments.

FIG. 22 is an example perspective view for explaining an electronic system including the non-volatile memory device according to some embodiments.

Referring to FIG. 22, an electronic system 4000 according to some embodiments may include a main board 4001, a controller 4002 mounted on the main board 4001, one or more semiconductor packages 4003, and a DRAM 4004. The semiconductor package 4003 and the DRAM 4004 may be connected to the controller 4002 by wiring patterns 4005 formed on the main board 4001.

The main board 4001 may include a connector 4006 including a plurality of pins coupled to an external host. In the connector 4006, the number and arrangement of the plurality of pins may vary depending on the communication interface between the electronic system 4000 and the external host. In some embodiments, the electronic system 4000 may communicate with the external host according to any one of interfaces such as M-Phy for USB (Universal Serial Bus), PCI-Express (Peripheral Component Interconnect Express), SATA (Serial Advanced Technology Attachment), and UFS (Universal Flash Storage). In some embodiments, the electronic system 4000 may be operated by power supplied from the external host through the connector 4006. The electronic system 4000 may further include a PMIC (Power Management Integrated Circuit) that distributes the power supplied from the external host to the controller 4002 and the semiconductor package 4003.

The controller 4002 may record data in the semiconductor package 4003 or read data from the semiconductor package 4003, and may improve the operating speed of the electronic system 4000.

The DRAM 4004 may be a buffer memory for alleviating a speed difference between the semiconductor package 4003, which is a data storage area, and the external host. The DRAM 4004 included in the electronic system 4000 may also operate as a kind of cache memory, and may also provide a space for temporarily storing data in the control operation of the semiconductor package 4003. When the DRAM 4004 is included in the electronic system 4000, the controller 4002 may further include a DRAM controller for controlling the DRAM 4004, in addition to a NAND controller for controlling the semiconductor package 4003.

The semiconductor package 4003 may include a first semiconductor package 4003a and a second semiconductor package 4003b that are spaced apart from each other. The first semiconductor package 4003a and the second semiconductor package 4003b may each be a semiconductor package that includes a plurality of semiconductor chips 4200. The first semiconductor package 4003a and the second semiconductor package 4003b may each include a package substrate 4100, semiconductor chips 4200 on the package substrate 4100, adhesive layers 4300 placed on the lower sides of each of the semiconductor chips 4200, a connection structure 4400 for electrically connecting the semiconductor chips 4200 and the package substrate 4100, and a molding layer 4500 that covers the semiconductor chips 4200 and the connection structure 4400 on the package substrate 4100.

The package substrate 4100 may be a printed circuit board that includes package upper pads 4130. Each semiconductor chip 4200 may include an I/O pad 4210. The I/O pad 4210 may correspond to the I/O pad 1101 of FIG. 21 Each of the semiconductor chips 4200 may include a plurality of conductive patterns 5210, channel structures, and monitoring channel structures 5220. Each of the semiconductor chips 4200 may include the non-volatile memory device described above referring to FIGS. 1 to 19.

In example embodiments, the connection structure 4400 may be a bonding wire that electrically connects the I/O pad 4210 and the package upper pads 4130. Therefore, in each of the first semiconductor package 4003a and the second semiconductor package 4003b, the semiconductor chips 4200 may be electrically connected to each other in a bonding wire manner, and may be electrically connected to the package upper pads 4130 of the package substrate 4100. According to the embodiments, in each of the first semiconductor package 4003a and the second semiconductor package 4003b, the semiconductor chips 4200 may also be electrically connected to each other by a connection structure including a through silicon via (TSV), instead of or in addition to the bonding wire type connection structure 4400.

In the example embodiments, the controller 4002 and the semiconductor chips 4200 may also be included in a single package. In the example embodiments, the controller 4002 and the semiconductor chips 4200 are mounted on a separate interposer board different from the main board 4001, and the controller 4002 and the semiconductor chips 4200 may also be connected to each other by the wiring formed on the interposer board.

Figure 23:
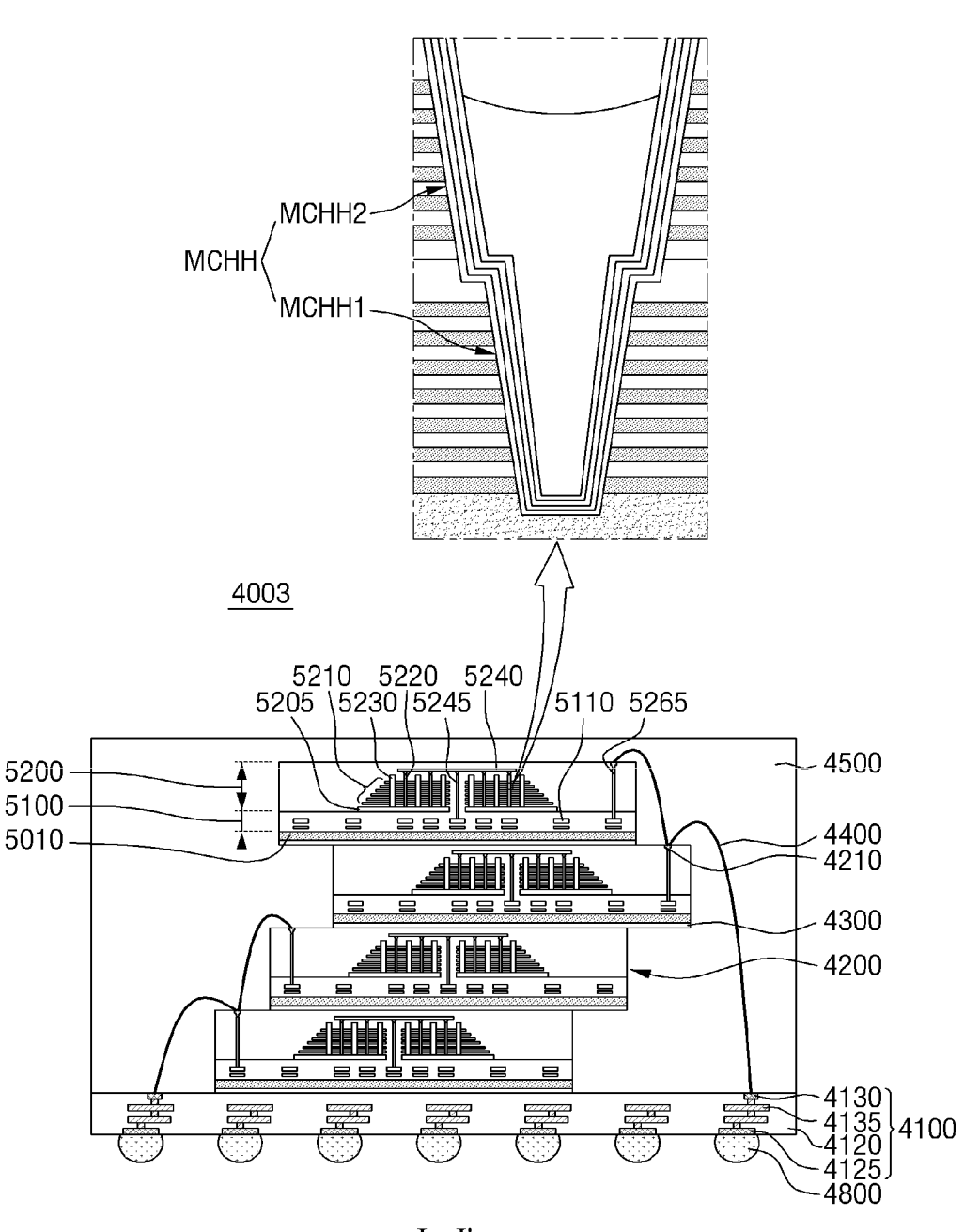
FIGS. 23, 24, and 25 are example cross-sectional views taken along I-I' of FIG. 22.
Figure 24:
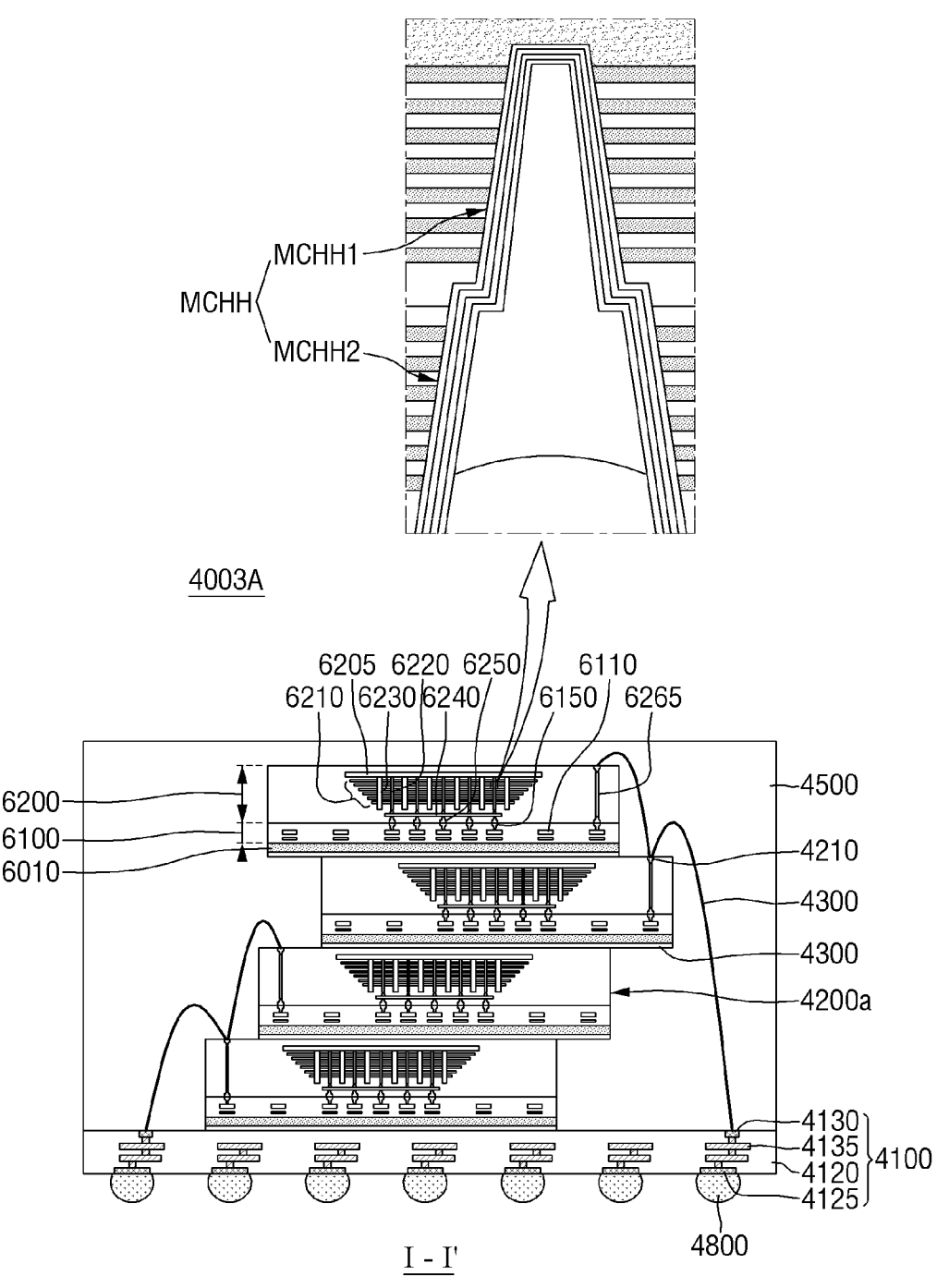
Figure 25:
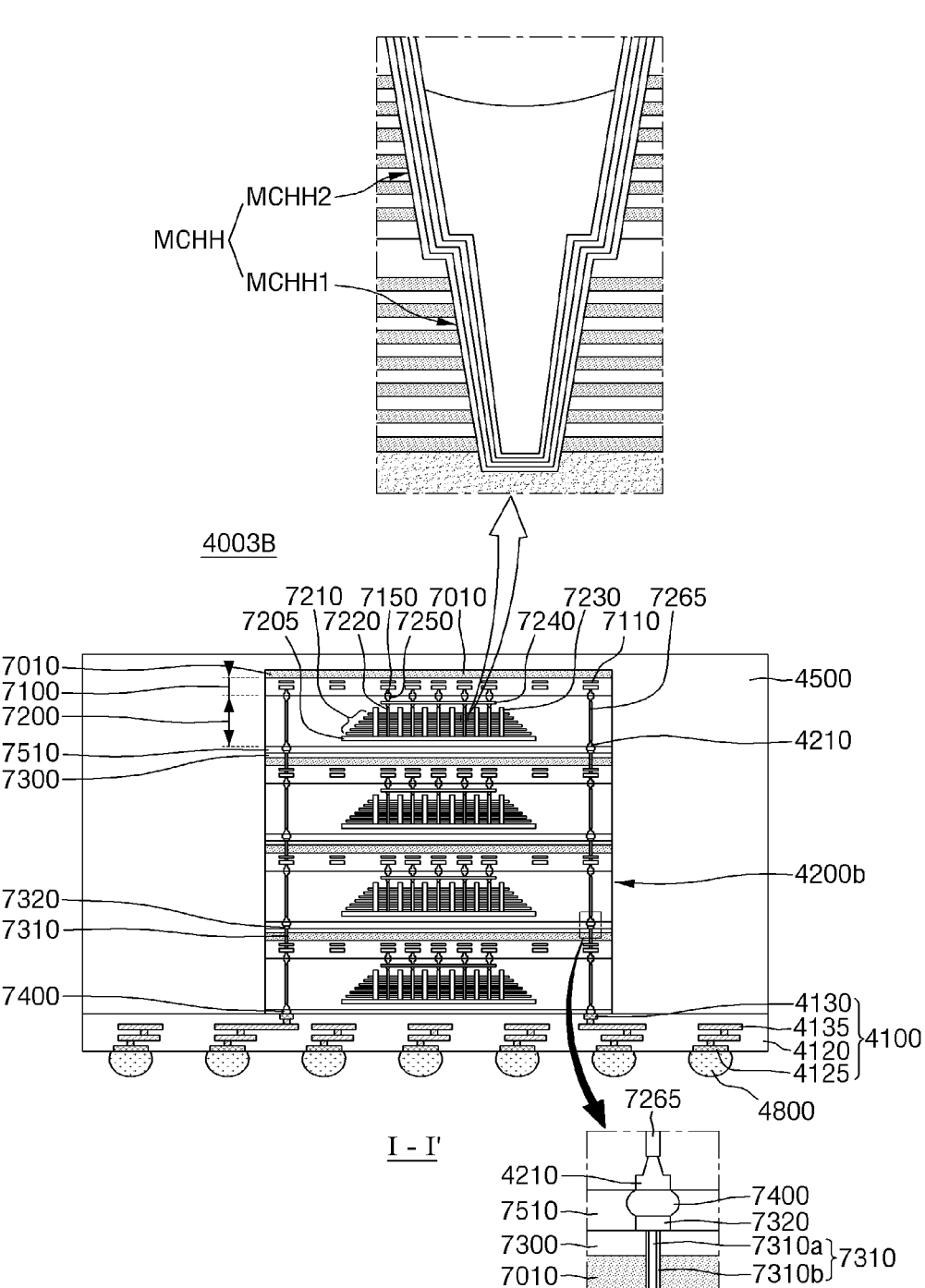

FIGS. 23 to 25 are example cross-sectional views taken along I-I' of FIG. 22.

Referring to FIG. 23, in the semiconductor package 4003, the package substrate 4100 may be a printed circuit board. The package substrate 4100 may include a package substrate body portion 4120, package upper pads 4130 placed on an upper side of the package substrate body portion 4120, lower pads 4125 placed on a lower side of the package substrate body portion 4120 or exposed through the lower side, and inner wirings 4135 that electrically connect the upper pads 4130 and the lower pads 4125 inside the package substrate body portion 4120. The upper pads 4130 may be electrically connected to the connection structures 4400. The lower pads 4125 may be connected to the wiring patterns 4005 of the main board 4001 of the electronic system 4000 through conductive connections 4800, as in FIG. 22.

Each of the semiconductor chips 4200 may include a semiconductor substrate 5010, and a first structure 5100 and a second structure 5200 that are sequentially stacked on the semiconductor substrate 5010. The first structure 5100 may include a peripheral circuit region including peripheral wirings 5110. The second structure 5200 may include a common source line 5205, conductive patterns 5210 on the common source line 5205, channel structures, monitoring channel structures 5220 and separation structures 5230 penetrating the conductive pattern 5210, bit lines 5240 electrically connected to the channel structures and the monitoring channel structures 5220, and gate connection wirings electrically connected to the word lines (WL of FIG. 21) of the conductive patterns 5210. Each of the semiconductor chips 4200 may further include monitoring channel structures, as explained in the enlarged view.

Each of the semiconductor chips 4200 may include a through wiring 5245 that is electrically connected to the peripheral wirings 5110 of the first structure 5100 and extends into the second structure 5200. The through wiring 5245 may penetrate the gate stacked structure 5210 and may be further placed outside the gate stacked structure 5210. Each of the semiconductor chips 4200 may further include an I/O connection wiring 5265 that is electrically connected to the peripheral wirings 5110 of the first structure 5100 and extends into the second structure 5200, and an I/O pad 4210 that is electrically connected to the I/O connection wiring 5265.

Referring to FIG. 24, in a semiconductor package 4003A, each of the semiconductor chips 4200a may include a semiconductor substrate 6010, a first structure 6100 on the semiconductor substrate 6010, and a second structure 6200 joined to the first structure 6100 on the first structure 6100 in the wafer bonding manner.

The first structure 6100 may include a peripheral circuit region that includes a peripheral wiring 6110 and a first joint structure 6150. The second structure 6200 may include a common source line 6205, conductive patterns 6210 between the common source line 6205 and the first structure 6100, channel structures and monitoring channel structures (collectively referred to as memory channel structures) 6220, and a separation structure 6230 penetrating the conductive patterns 6210, and second joint structures 6250 electrically connected to the word lines (WL of FIG. 21) of the memory channel structures 6220 and the gate stacked structure 6210. For example, the second joint structures 6250 may each be electrically connected to the memory channel structures 6220 and the word lines (WL of FIG. 21) through bit lines 6240 electrically connected to the memory channel structures 6220 and gate connection wirings electrically connected to the word lines (WL of FIG. 21). The first joint structures 6150 of the first structure 6100 and the second joint structures 6250 of the second structure 6200 may be joined, while being in contact with each other. Joined portions between the first joint structure 6150 and the second joint structure 6250 may be formed of, for example, copper (Cu).

Each of the second structure 6200 and the semiconductor chips 4200a may further include a monitoring channel structure described through FIGS. 1 to 19, as shown in the enlarged view. Each of the semiconductor chips 4200a may further include an I/O pad 4210, and an I/O connection wiring 6265 below the I/O pad 4210. The I/O connection wiring 6265 may be electrically connected to a part of the second joint structure 6250.

The semiconductor chips 4200 of FIG. 23 and the semiconductor chips 4200a of FIG. 24 may be electrically connected to each other by connection structures 4400 in the form of a bonding wire. However, in the example embodiments, the semiconductor chips in a single semiconductor package, such as the semiconductor chips 4200 of FIG. 23 and the semiconductor chips 4200a of FIG. 3 may also be electrically connected to each other by a connection structure including the through silicon via (TSV).

Referring to FIG. 25, in the semiconductor package 4003B, the semiconductor chips 4200b may be arranged perpendicularly to and vertically aligned to each other. Each of the semiconductor chips 4200b may include a semiconductor substrate 7010, a first structure 7100 formed below the semiconductor substrate 7010, and a second structure 7200 joined to the first structure 7100 in the wafer bonding manner below the first structure 7100.

The first structure 7100 may include a peripheral circuit region that includes a peripheral wiring 7110 and first joint structures 7150. The second structure 7200 may include a common source line 7205, a gate stacked structure 7210 between the common source line 7205 and the first structure 7100, memory channel structures 7220 and separation structures 7230 penetrating the gate stacked structure 7210, and a second joint structure 7250 electrically connected to the word lines (WL of FIG. 21) of the memory channel structures 7220 and the gate stacked structure 7210. For example, the second joint structures 7250 may be electrically connected to the memory channel structures 7220 and the word lines (WL of FIG. 21) through bit lines 7240 electrically connected to the memory channel structures 7220 and the gate connection wirings electrically connected to the word lines (WL of FIG. 21). The first joint structures 7150 of the first structure 7100 and the second joint structures 7250 of the second structure 7200 may be joined, while being in contact with each other. Joined portions between the first joint structures 7150 and the second joint structures 7250 may be formed of, for example, copper (Cu).

Among the semiconductor chips 4200b, the remaining semiconductor chips except the uppermost semiconductor chip may further include a rear insulating layer 7300 on the semiconductor substrate 7010, rear I/O pads 7320 on the rear insulating layer 7300, and through silicon via structures 7310 that penetrate the semiconductor substrate 7010 and the rear insulating layer 7300 and electrically connect the peripheral wirings 7110 of the first structure 7100 and the rear I/O pad 7320. Each of the through silicon via structures 7310 may include a through silicon via 7310a, and an insulating spacer 7310b that surrounds the side faces of the through silicon via 7310a. A semiconductor device 4003B may further include connection structures 7400 placed below each of the semiconductor chips 4200b, for example, conductive bumps. The connection structures 7400 may electrically connect the semiconductor chips 4200b, and may electrically connect the semiconductor chips 4200b and the package substrate 4100. An underfill material layer 7510 may surround the side faces of the conductive bump 7400.

Although embodiments of the present disclosure have been described above with reference to the accompanying drawings, it will be understood by those of ordinary skill in the art that the present disclosure is not limited thereto and may be implemented in many different forms without departing from the technical idea or essential features thereof. Therefore, it should be understood that the embodiments set forth herein are merely examples in all respects and not restrictive.

What is claimed is:

1. A non-volatile memory device comprising:
    a first stack comprising first conductive patterns and first dielectric layers that are alternately stacked in a first direction on a substrate;
    a second stack comprising second conductive patterns and second dielectric layers that are alternately stacked in the first direction on the first stack opposite the substrate;
    a first monitoring channel structure that penetrates the first stack in the first direction; and
    a second monitoring channel structure that penetrates the second stack in the first direction and is on the first monitoring channel structure,
    wherein a top of the first monitoring channel structure is opposite the substrate and is in contact with a bottom of the second monitoring channel structure, and
    wherein a width of the top of the first monitoring channel structure opposite the substrate is smaller than a width of the bottom of the second monitoring channel structure.

2. The non-volatile memory device of claim 1, further comprising:
    a capping film on a top of the second monitoring channel structure opposite the bottom thereof,
    wherein a bottom of the capping film has a curved shape that protrudes toward the bottom of the second monitoring channel structure.

3. The non-volatile memory device of claim 1, further comprising:
    a first channel structure that penetrates the first stack in the first direction; and
    a second channel structure that penetrates the second stack in the first direction and is on the first channel structure,
    wherein a width of a top of the first channel structure opposite the substrate is greater than a width of a bottom of the second channel structure adjacent the top of the first channel structure.

4. The non-volatile memory device of claim 1, wherein the width of the top of the first monitoring channel structure is smaller than a narrowest width of the second monitoring channel structure.

5. The non-volatile memory device of claim 1, further comprising:
    a first channel structure that penetrates the first stack in the first direction; and
    a second channel structure that penetrates the second stack in the first direction and is placed on the first channel structure,
    wherein a width of a top of the first channel structure opposite the substrate is the same as a width of a top of the second channel structure opposite the top of the first channel structure.

6. The non-volatile memory device of claim 1, further comprising:
    a channel structure that penetrates the first stack and the second stack in the first direction,
    wherein the channel structure is configured to store data, and the first monitoring channel structure and the second monitoring channel structure are not configured to store data.

7. The non-volatile memory device of claim 1, wherein the first monitoring channel structure and the second monitoring channel structure are configured to store data.

8. A non-volatile memory device comprising:
    a first stack comprising first conductive patterns and first dielectric layers that are alternately stacked in a first direction;
    a second stack comprising second conductive patterns and second dielectric layers that are alternately stacked in the first direction on the first stack;
    a first monitoring channel structure that penetrates the first stack in the first direction;
    a second monitoring channel structure that penetrates the second stack in the first direction and is on the first monitoring channel structure, wherein a top of the first monitoring channel structure is in contact with a bottom of the second monitoring channel structure; and
    a capping film on a top of the second monitoring channel structure opposite the bottom of the second monitoring channel structure,
    wherein a width of the top of the first monitoring channel structure is smaller than a width of the bottom of the second monitoring channel structure that is opposite the capping film,
    the first monitoring channel structure and the second monitoring channel structure comprise a data storage layer, a channel layer, and a buried insulating layer that are sequentially stacked along side walls of the first monitoring channel structure and side walls of the second monitoring channel structure that extend between the top and the bottom thereof.

9. The non-volatile memory device of claim 8, wherein a bottom of the capping film is adjacent the buried insulating layer and has a curved shape.

10. The non-volatile memory device of claim 8, further comprising:

a first channel structure that penetrates the first stack in the first direction; and a second channel structure that penetrates the second stack in the first direction and is on the first channel structure, wherein a width of a top of the first channel structure opposite a substrate is greater than a width of a bottom of the second channel structure adjacent the top of the first channel structure.

11. The non-volatile memory device of claim 8, wherein the width of the top of the first monitoring channel structure is smaller than a narrowest width of the second monitoring channel structure.

12. The non-volatile memory device of claim 8, further comprising:

a first channel structure that penetrates the first stack in the first direction; and a second channel structure that penetrates the second stack in the first direction and is on the first channel structure, wherein a width of a top of the first channel structure opposite a substrate is the same as a width of a top of the second channel structure opposite the top of the first channel structure.

13. The non-volatile memory device of claim 8, further comprising:

a channel structure that penetrates the first stack and the second stack in the first direction, wherein the channel structure is configured to store data, and the first monitoring channel structure and the second monitoring channel structure are not configured to store data.

14. The non-volatile memory device of claim 8, wherein the first monitoring channel structure and the second monitoring channel structure are configured to store data.

15. A non-volatile memory system comprising:

a non-volatile memory device comprising:

a first stack comprising first conductive patterns and first dielectric layers that are alternately stacked in a first direction on a substrate;

a second stack comprising second conductive patterns and second dielectric layers that are alternately stacked in the first direction on the first stack opposite the substrate;

a first monitoring channel structure that penetrates the first stack in the first direction;

a second monitoring channel structure that penetrates the second stack in the first direction and is on the first monitoring channel structure, wherein a top of the first monitoring channel structure is opposite the substrate and is in contact with a bottom of the second monitoring channel structure, a width of the top of the first monitoring channel structure opposite the substrate being smaller than a width of the bottom of the second monitoring channel structure;

a peripheral circuit comprising a decoder, a page buffer, and a logic circuit; and an I/O pad that is electrically connected to the peripheral circuit; and a controller that is electrically connected to the non-volatile memory device through the I/O pad and is configured to control the non-volatile memory device, wherein the first monitoring channel structure and the second monitoring channel structure are not configured to store data.

16. The non-volatile memory system of claim 15, further comprising:

a capping film on the second monitoring channel structure opposite the bottom thereof; and a data storage layer, a channel layer, and a buried insulating layer stacked sequentially along side walls of the first monitoring channel structure and side walls of the second monitoring channel structure.

17. The non-volatile memory system of claim 16, wherein a bottom of the capping film adjacent the buried insulating layer has a curved shape.

18. The non-volatile memory system of claim 15, further comprising:

a first channel structure that penetrates the first stack in the first direction; and a second channel structure that penetrates the second stack in the first direction and is on the first channel structure, wherein a width of a top of the first channel structure opposite the substrate is greater than a width of a bottom of the second channel structure adjacent the top of the first channel structure.

19. The non-volatile memory system of claim 15, further comprising:

a channel structure that penetrates the first stack and the second stack in the first direction, wherein the channel structure is configured to store data.

20. The non-volatile memory system of claim 15, wherein the first monitoring channel structure extends from the bottom of the second monitoring channel structure to the substrate, and wherein the width of the top of the first monitoring channel structure is smaller than a narrowest width of the second monitoring channel structure.

* * * * *